US012568593B2

(12) United States Patent
Liu et al.

(10) Patent No.: US 12,568,593 B2
(45) Date of Patent: Mar. 3, 2026

(54) FOLDABLE ELECTRONIC DEVICE

(71) Applicant: BEIJING XIAOMI MOBILE SOFTWARE CO., LTD., Beijing (CN)

(72) Inventors: Zhaofeng Liu, Beijing (CN); Cuncun Xu, Beijing (CN); Haiyue Li, Beijing (CN); Xin Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 162 days.

(21) Appl. No.: 18/626,316

(22) Filed: Apr. 3, 2024

(65) Prior Publication Data

US 2025/0063675 A1      Feb. 20, 2025

(30) Foreign Application Priority Data

Aug. 14, 2023      (CN) .......................... 202311022645.0

(51) Int. Cl.
*H05K 5/02*              (2006.01)

(52) U.S. Cl.
CPC .................................. *H05K 5/0226* (2013.01)

(58) Field of Classification Search
CPC ...................................................... H05K 7/13
See application file for complete search history.

(56)                References Cited

U.S. PATENT DOCUMENTS

2022/0321683 A1*  10/2022  Luo ...................... H04M 1/0268
2022/0386487 A1    12/2022  Lee et al.
2023/0189463 A1*   6/2023  Woo ...................... G06F 1/1681
                                                          361/749

OTHER PUBLICATIONS

The Extended European Search Report issued in Application No. 24169598.0 dated Oct. 15, 2024, (10p).

* cited by examiner

Primary Examiner — Jerry Wu
(74) Attorney, Agent, or Firm — Arch & Lake LLP; Hao Tan; Shen Wang

(57)                ABSTRACT

A foldable electronic device includes a rotation shaft, a housing assembly and a flexible circuit board. The housing assembly includes a first housing and a second housing, and the first housing and the second housing are rotatably connected to both sides of the rotation shaft, respectively. The first housing has a first arc-shaped surface, and in a process of switching from a folded state to a flattened state, the first arc-shaped surface abuts against the bending part, to guide the bending part to bend into a preset shape; and/or the second housing has a second arc-shaped surface, and in a process of switching from a folded state to a flattened state, the second arc-shaped surface abuts against the bending part, to guide the bending part to bend into a preset shape.

11 Claims, 8 Drawing Sheets

FOLDABLE ELECTRONIC DEVICE

CROSS-REFERENCE TO RELATED APPLICATION

This application is based on and claims priority to Chinese Patent Application No. 202311022645.0 filed on Aug. 14, 2023, the entire contents of which are incorporated herein by reference for all purposes.

BACKGROUND

A foldable electronic device has gained widespread attention and favor from a consumer because it may provide a large display area during use and may be folded for convenient storage during storage. The foldable electronic device includes a rotation shaft and housings arranged at both sides of the rotation shaft, and the housings may be rotated relative to the rotation shaft to achieve folding or unfolding. Electronic elements are arranged inside the housings, and the electronic elements inside two housings are electrically connected through a flexible circuit board that passes through the rotation shaft. The flexible circuit board typically includes a fixed part and a bending part. The fixed part is connected with the housing to achieve the installation and fixation of the flexible circuit board, the bending part is arranged in a space enclosed by the rotation shaft and the housing, and the bending part allows the flexible circuit board to have a sufficient redundant length to meet the need of bending. During use of the foldable electronic device, there is a problem of a large local stress on the bending part of the flexible circuit board, thus resulting in a problem of the flexible circuit board being prone to fracture failure, and affecting the service life of the foldable electronic device.

SUMMARY

The present disclosure relates to a field of electronic devices, and more particularly to a foldable electronic device.

In a first aspect, some embodiments of this disclosure provide a foldable electronic device, including: a rotation shaft, a housing assembly and a flexible circuit board, the housing assembly includes a first housing and a second housing, and the first housing and the second housing are rotatably connected to both sides of the rotation shaft, respectively, to allow the foldable electronic device to switch between a flattened state and a folded state. The first housing has a first arc-shaped surface, and in a process of switching from the folded state to the flattened state, the first arc-shaped surface abuts against the bending part, to guide the bending part to bend into a preset shape; and/or, the second housing has a second arc-shaped surface, and in a process of switching from the folded state to the flattened state, the second arc-shaped surface abuts against the bending part, to guide the bending part to bend into a preset shape.

In a second aspect, some embodiments of this disclosure provide a foldable electronic device, including a rotation shaft, a housing assembly and a flexible circuit board, the housing assembly includes a first housing and a second housing, and the first housing and the second housing are rotatably connected to both sides of the rotation shaft, respectively, to allow the foldable electronic device to switch between a flattened state and a folded state. The flexible circuit board includes a plurality of layers of circuit board bodies arranged in a stack. The first housing has a first mounting part, the flexible circuit board includes a first fixed part and a bendable bending part arranged in sequence, the first fixed part is connected with the first mounting part, the first fixed part includes a first adhesive portion and a first non-adhesive portion, adjacent two layers of circuit board bodies are bonded at the first adhesive portion, and the adjacent two layers of circuit board bodies are configured to move relative to each other at the first non-adhesive portion; and/or, the second housing has a second mounting part, the flexible circuit board includes a bendable bending part and a second fixed part arranged in sequence, the second fixed part is connected with the second mounting part, the second fixed part includes a second adhesive portion and a second non-adhesive portion, adjacent two layers of circuit board bodies are bonded at the second adhesive portion, and the adjacent two layers of circuit board bodies are configured to move relative to each other at the second non-adhesive portion.

DETAILED DESCRIPTION

Figure 1:
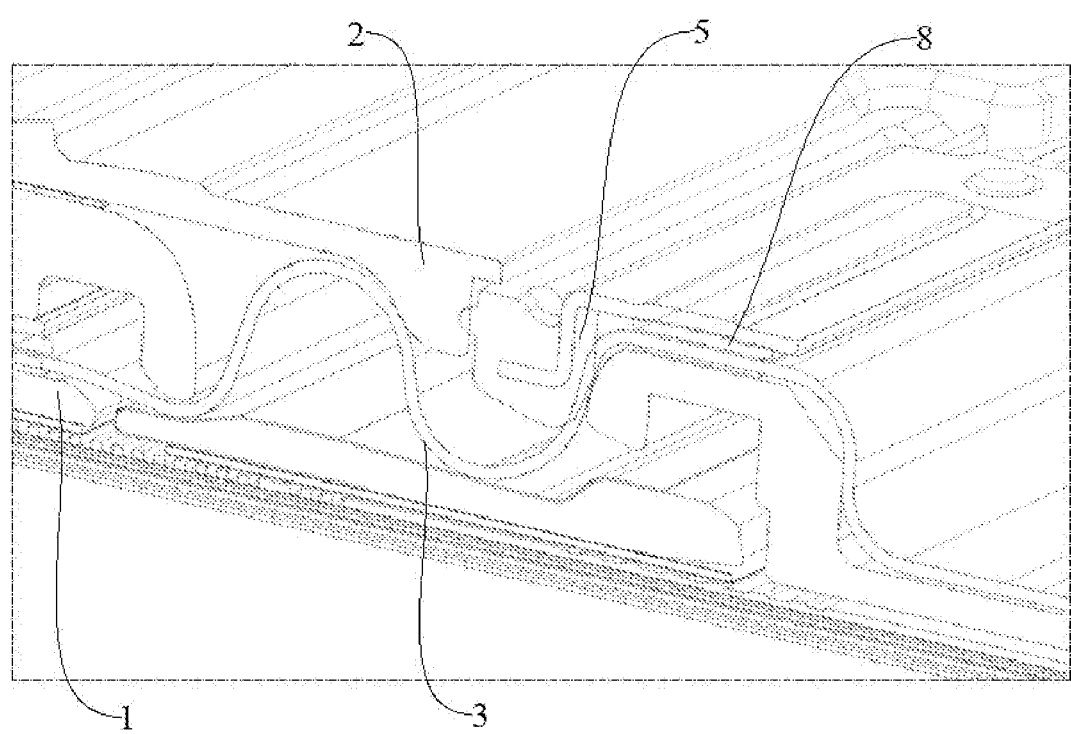
FIG. 1 is a schematic view of an internal structure of an electronic device according to an embodiment of the present disclosure from a perspective.
Figure 2:
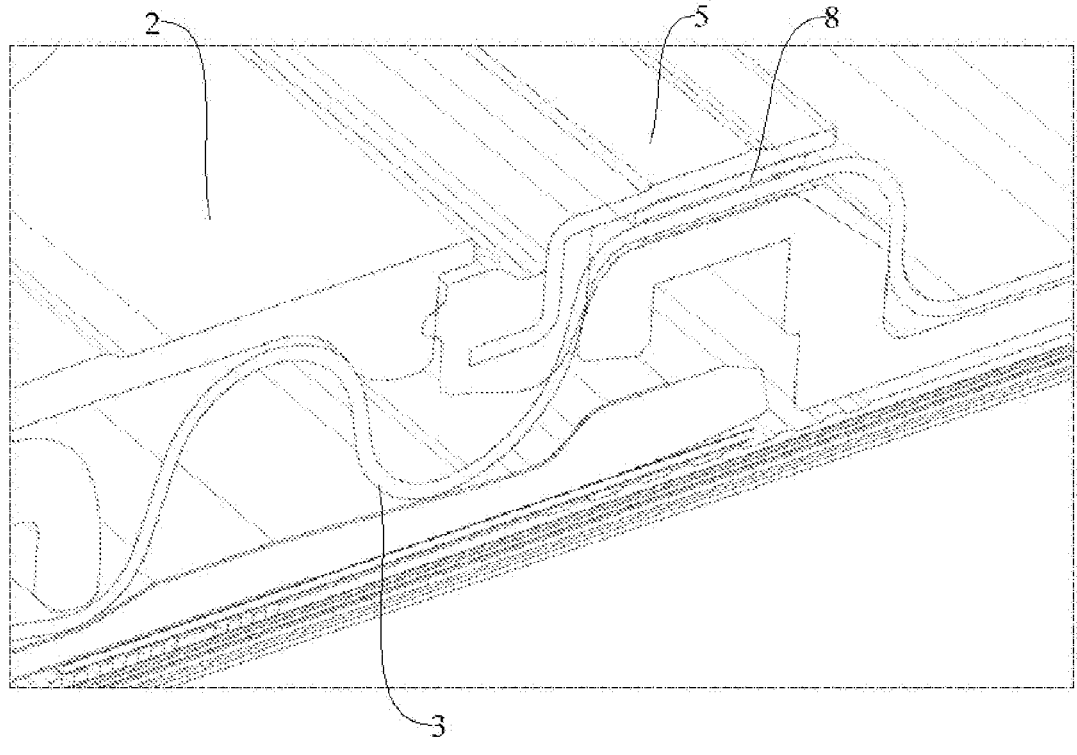
FIG. 2 is a schematic view of an internal structure of an electronic device according to an embodiment of the present disclosure from another perspective.

In a foldable electronic device in the related art, an abutting part is typically arranged on a housing and other components, and the abutting part abuts against a bending part of a flexible circuit board so that the bending part is bent. The abutting part is in line contact with the bending part of the flexible circuit board, which cannot control a bending radius of the bending part, resulting in a small local bending radius of the bending part. During use of the foldable electronic device, i.e. in a process of folding or unfolding the foldable electronic device, there is a phenomenon of stress concentration at a small bending radius of the flexible circuit board, which results in a large stress at the small bending radius, further results in a problem that the flexible circuit board is prone to fracture failure, and affects the service life of the foldable electronic device.

In the a foldable electronic device according to embodiments of the present disclosed, by innovatively designing the abutting part in contact with the bending part of the flexible circuit board and utilizing the fit between the abutting part and the bending part of the flexible circuit board, the bending radius of the bending part can be controlled, to avoid that the bending radius of the bending part is too small. Accordingly, during the use of the foldable electronic device, the problem of a large local stress on the flexible circuit board can be alleviated, the risk of fracture failure of the flexible circuit board is reduced, and the service life of the foldable electronic device is prolonged.

Embodiments of the present disclosure are described in detail below, examples of which are shown in the accompanying drawings. The following embodiments described with reference to the accompanying drawing are illustrative. The embodiments described are intended to explain the present disclosure, but not to limit the present disclosure.

Embodiment 1

As shown in FIG. 1 to FIG. 9, a foldable electronic device 100 according to the embodiment of the present disclosure includes a rotation shaft 1, a housing assembly 2 and a flexible circuit board 3. The housing assembly 2 includes a first housing 21 and a second housing 22, and the first housing 21 and the second housing 22 are rotatably connected to both sides of the rotation shaft 1, respectively, so that the foldable electronic device 100 may switch between a flattened state and a folded state. The flexible circuit board 3 includes a bendable bending part 32. The first housing 21 is rotatably connected with the rotation shaft 1, so that the first housing 21 may rotate relative to the rotation shaft 1. The second housing 22 is rotatably connected with the rotation shaft 1, so that the second housing 22 may rotate relative to the rotation shaft 1. A part of a flexible screen of the foldable electronic device 100 is connected to the first housing 21, and another part of the flexible screen of the foldable electronic device 100 is connected to the second housing 22. When the first housing 21 and the second housing 22 move towards each other, the flexible screen may be driven to be folded, and when the first housing 21 and the second housing 22 move away from each other, the flexible screen may be driven to be flattened. In some embodiments of the present disclosure, in addition to the flattened state and the folded state, the foldable electronic device 100 may also be in an intermediate state between the flattened state and the folded state, and any states between the flattened state and the folded state may be the intermediate state, that is, the intermediate state is not unique.

The first housing 21 has a first arc-shaped surface 212, and in a process of switching from the folded state to the flattened state, the first arc-shaped surface 212 abuts against the bending part 32, to guide the bending part 32 to bend into a preset shape; and/or, the second housing 22 has a second arc-shaped surface 222, and in the process of switching from the folded state to the flattened state, the second arc-shaped surface 222 abuts against the bending part 32, to guide the bending part 32 to bend into the preset shape. In other words, only the first housing 21 is provided with the first arc-shaped surface 212, and in the process of the foldable electronic device 100 switching from the folded state to the flattened state, the first arc-shaped surface 212 is configured to abut against the bending part 32, to guide the bending part 32 to bend into the preset shape; or, only the second housing 22 is provided with the second arc-shaped surface 222, and in the process of the foldable electronic device 100 switching from the folded state to the flattened state, the second arc-shaped surface 222 is configured to abut against the bending part 32, to guide the bending part 32 to bend into the preset shape; or, the first housing 21 is provided with the first arc-shaped surface 212, and the second housing 22 is provided with the second arc-shaped surface 222, and in the process of the foldable electronic device 100 switching from the folded state to the flattened state, the first arc-shaped surface 212 and the second arc-shaped surface 222 are configured to abut against part of the bending part 32, respectively, to guide the bending part 32 to bend into the preset shape. The first arc-shaped surface 212 is arranged on a side of the first housing 21 adjacent to the flexible circuit board 3, and the second arc-shaped surface 222 is arranged on a side of the second housing 22 adjacent to the flexible circuit board 3.

The first arc-shaped surface 212 guides the bending part 32 to bend into the preset shape. In some embodiments of the present disclosure, part of the bending part 32 is fitted with at least part of the first arc-shaped surface 212, so that a shape of the part of the bending part 32 is consistent with a shape of the at least part of the first arc-shaped surface 212, and thus the bending part 32 as a whole is bent into the preset shape. The second arc-shaped surface 222 guides the bending part 32 to bend into the preset shape. In some embodiments of the present disclosure, part of the bending part 32 is fitted with at least part of the second arc-shaped surface 222, so that a shape of the part of the bending part 32 is consistent with a shape of the at least part of the second arc-shaped surface 222, and hence the bending part 32 as a whole is bent into the preset shape. In some embodiments of the present disclosure, the preset shape may be a predesigned shape, that is, a designed shape.

In the foldable electronic device 100 according to the embodiment of the present disclosure, the folding and unfolding of the foldable electronic device 100 may be achieved, that is, the foldable electronic device 100 switches between the flattened state and the folded state, by rotating the first housing 21 and the second housing 22 relative to the rotation shaft 1.

The first housing 21 is provided with the first arc-shaped surface 212, and in the process of switching from the folded state to the flattened state, the first arc-shaped surface 212 is configured to abut against the bending part 32 to guide the bending part 32 to bend into the preset shape, so that the first arc-shaped surface 212 is in surface contact with the bending part 32. When the first arc-shaped surface 212 abuts against the bending part 32, a shape of part of the bending part 32 in contact with the first arc-shaped surface 212 is consistent with of that of the first arc-shaped surface 212, so that a bending radius of the part of the bending part 32 in contact with the first arc-shaped surface 212 is controllable. By rationally designing the first arc-shaped surface 212, the bending radius of the bending part 32 may be large, thus alleviating the problem of the large local stress on the flexible circuit board 3, reducing the risk of fracture failure of the flexible circuit board 3, and prolonging the service life of the foldable electronic device 100.

The second housing 22 is provided with the second arc-shaped surface 222, and in the process of switching from the folded state to the flattened state, the second arc-shaped surface 222 is configured to abut against the bending part 32 to guide the bending part 32 to bend into the preset shape, so that the first arc-shaped surface 222 is in surface contact with the bending part 32. When the second arc-shaped surface 222 abuts against the bending part 32, a shape of part of the bending part 32 in contact with the second arc-shaped surface 222 is consistent with of that of the second arc-shaped surface 222, so that a bending radius of the part of the bending part 32 in contact with the second arc-shaped surface 222 is controllable. By rationally designing the second arc-shaped surface 222, the bending radius of the bending part 32 may be large, thus alleviating the problem of the large local stress on the flexible circuit board 3, reducing the risk of fracture failure of the flexible circuit board 3, and prolonging the service life of the foldable electronic device 100.

Figure 3:
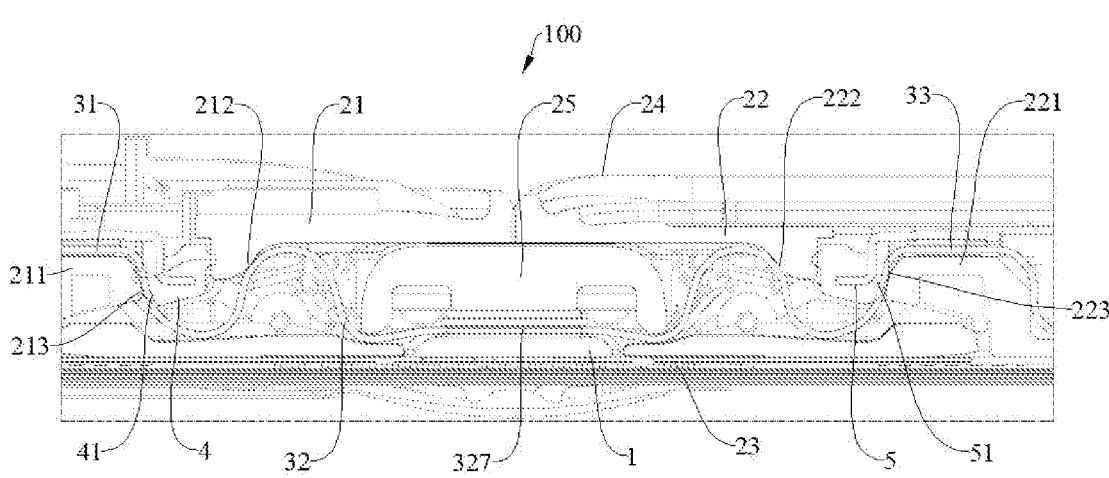
FIG. 3 is a sectional front view of an electronic device according to an embodiment of the present disclosure.
Figure 4:
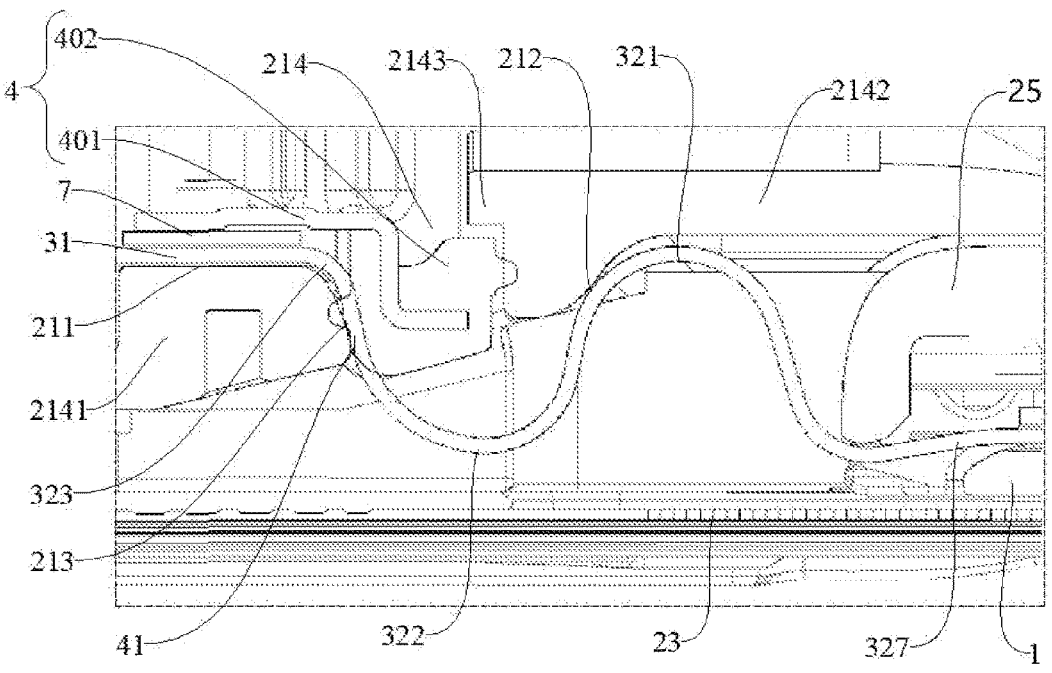
FIG. 4 is a schematic view of a structure on one side of the rotation shaft in FIG. 3.
Figure 5:
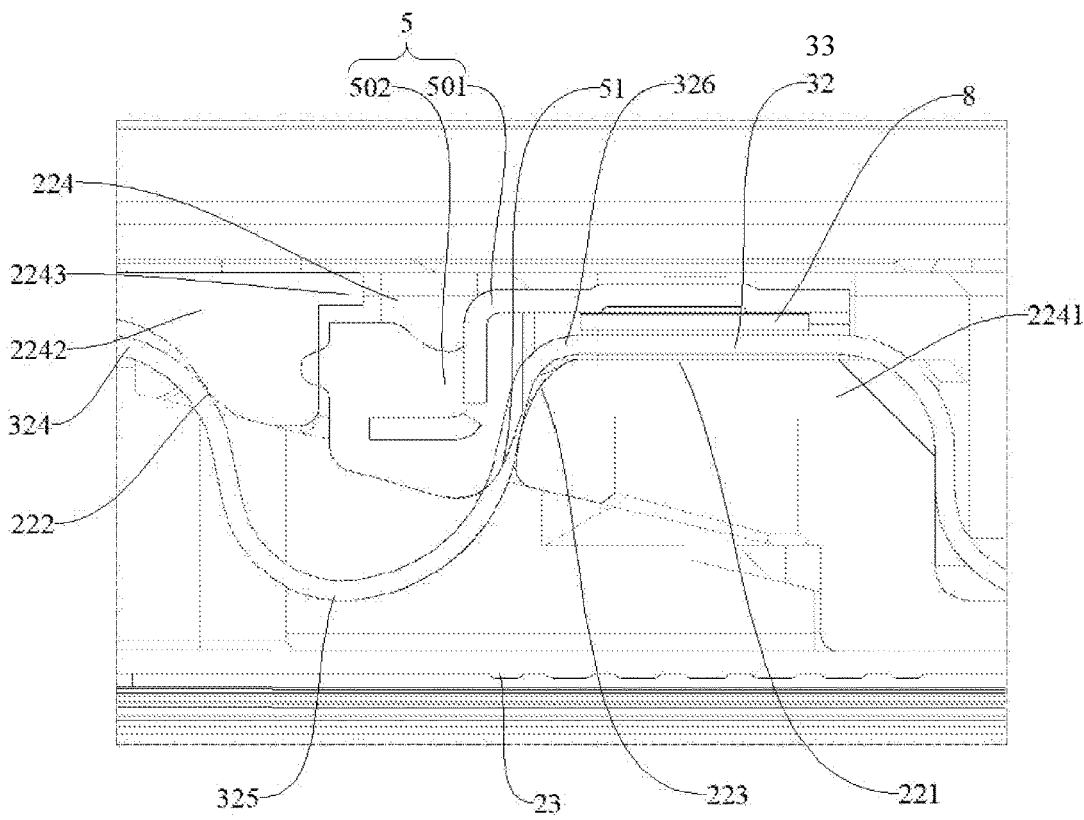
FIG. 5 is a schematic view of a structure on the other side of the rotation shaft in FIG. 3.

As shown in FIG. 3 to FIG. 5, the flexible circuit board 3 includes a first fixed part 31 and a second fixed part 33, and the bending part 32 is arranged between the first fixed part 31 and the second fixed part 33. The first housing 21 has a first mounting part 211, and the first fixed part 31 is connected with the first mounting part 211. The second housing 22 has a second mounting part 221, and the second fixed part 33 is connected with the second mounting part 221. The first arc-shaped surface 212 is arranged between the first mounting part 211 and the rotation shaft 1, and the second arc-shaped surface 222 is arranged between the second mounting part 221 and the rotation shaft 1.

The first fixed part 31 of the flexible circuit board 3 is connected with the first mounting part 211 of the first housing 21, to achieve the connection between the flexible circuit board 3 and the first housing 21, so that when the first housing 21 rotates relative to the rotation shaft 1, the first fixed part 31 may be moved with the first housing 21 by bending of the bending part 32, which ensures reliable connection between the flexible circuit board 3 and components inside the first housing 21. The second fixed part 33 of the flexible circuit board 3 is connected with the second mounting part 221 of the second housing 22, to achieve the connection between the flexible circuit board 3 and the second housing 22, so that when the second housing 22 rotates relative to the rotation shaft 1, the second fixed part 33 may be moved with the second housing 22 by bending of the bending part 32, which ensures reliable connection between the flexible circuit board 3 and components inside the second housing 22. Thus, this is conducive to improving the reliability of the foldable electronic device 100.

As shown in FIG. 3 and FIG. 4, the bending part 32 further includes a penetrating-shaft portion 327, the penetrating-shaft portion 327 passes through the rotation shaft 1, so that part of the bending part 32 is located inside the rotation shaft 1, part of the bending part 32 is located on one side of the rotation shaft 1, and another part of the bending part 32 is located on the other side of the rotation shaft 1.

As shown in FIG. 3 and FIG. 4, the housing assembly 2 further includes a shaft cover 25, the shaft cover 25 is connected to the rotation shaft 1, and the penetrating-shaft portion 327 is arranged between the rotation shaft 1 and the shaft cover 25. The first housing 21 is hermetically fitted with the shaft cover 25, and the second housing 22 is hermetically fitted with the shaft cover 25.

The shaft cover 25 is provided, the first housing 21 is hermetically fitted with the shaft cover 25, and the second housing 22 is hermetically fitted with the shaft cover 25, which, on the one hand, may prevent the rotation shaft 1 being exposed to outside during the use of the foldable electronic device 100 and affecting the aesthetics of the foldable electronic device 100, and on the other hand, may improve the sealing performance of the housing assembly 2, enhance the waterproof performance of the housing assembly 2, and thus enhance the waterproof performance of the foldable electronic device 100.

In some embodiments, as shown in FIG. 3 to FIG. 5, the foldable electronic device 100 further includes a first compressing member 4, and the first compressing member 4 is connected to the first housing 21. The first compressing member 4 has a third arc-shaped surface 41. In the process of switching from the folded state to the flattened state, the third arc-shaped surface 41 abuts against the bending part 32 to guide the bending part 32 to bend into the preset shape. The third arc-shaped surface 41 is arranged on a side of the first compressing member 4 adjacent to the flexible circuit board 3, and the third arc-shaped surface 41 is arranged between the first mounting part 211 and the rotation shaft 1.

By arranging the third arc-shaped surface 41 on the first compressing member 4, in the process of the foldable electronic device 100 switching from the folded state to the flattened state, the third arc-shaped surface 41 is configured to abut against the bending part 32, to guide the bending part 32 to bend into the preset shape by the third arc-shaped surface 41, so that the bending part 32 may be bent into the preset shape more easily. By rationally designing the third arc-shaped surface 41, the bending radius of the bending part 32 may be large, thus alleviating the problem of the large local stress on the flexible circuit board 3, further reducing the risk of fracture failure of the flexible circuit board 3, and prolonging the service life of the foldable electronic device 100.

In some embodiments, the foldable electronic device 100 further includes a second compressing member 5, and the second compressing member 5 is connected to the second housing 22. The second compressing member 5 has a fourth arc-shaped surface 51. In the process of switching from the folded state to the flattened state, the fourth arc-shaped surface 51 abuts against the bending part 32 to guide the bending part 32 to bend into the preset shape. The fourth arc-shaped surface 51 is arranged on a side of the second compressing member 5 adjacent to the flexible circuit board 3, and the fourth arc-shaped surface 51 is arranged between the second mounting part 221 and the rotation shaft 1.

By arranging the fourth arc-shaped surface 51 on the second compressing member 5, in the process of the foldable electronic device 100 switching from the folded state to the flattened state, the fourth arc-shaped surface 51 is configured to abut against the bending part 32, to guide the bending part 32 to bend into the preset shape by the fourth arc-shaped surface 51, so that the bending part 32 can be bent into the preset shape more easily. By rationally designing the fourth arc-shaped surface 51, the bending radius of the bending part 32 may be large, thus alleviating the problem of the large local stress on the flexible circuit board 3, further reducing the risk of fracture failure of the flexible circuit board 3, and prolonging the service life of the foldable electronic device 100.

As shown in FIG. 3 and FIG. 4, in the flattened state, the housing assembly 2 has a first surface 23 and a second surface 24 facing away each other, and one of the first surface 23 and the second surface 24 is configured to support the flexible screen. For example, in FIG. 3 and FIG. 4, the first surface 23 is configured to support the flexible screen.

In some embodiments, in the flattened state, the bending part 32 includes a first convex portion 321, a second convex portion 322 and a third convex portion 323 arranged in sequence, the second convex portion 322 is arranged to protrude towards the first surface 23, and the first convex portion 321 and the third convex portion 323 are arranged to protrude away from the first surface 23. The first arc-shaped surface 212 abuts against part of the first convex portion 321 adjacent to the second convex portion 322 in a direction towards the first surface 23, and the third arc-shaped surface 41 abuts against part of the third convex portion 323 adjacent to the second convex portion 322 in the direction towards the first surface 23.

In some embodiments of the present disclosure, in the flattened state, the part of the first convex portion 321 adjacent to the second convex portion 322 and the part of the third convex portion 323 adjacent to the second convex portion 322 both have a restoring elastic force in a direction facing away from the first surface 23. By the first arc-shaped surface 212 abutting against the part of the first convex portion 321 adjacent to the second convex portion 322 in the direction towards the first surface 23, and by the third arc-shaped surface 41 abutting against the part of the third convex portion 323 adjacent to the second convex portion 322 in the direction towards the first surface 23, the bending part 32 can be bent according to the preset shape more easily, which is conducive to further reducing the risk of fracture failure of the flexible circuit board 3 and prolonging the service life of the foldable electronic device 100.

In addition, by arranging the first convex portion 321, the second convex portion 322 and the third convex portion 323, the bending part 32 is bent many times, so that the overall length of the bending part 32 is large in a limited space, that is, the redundant length of the flexible circuit board 3 is large, which is conducive to improving the utilization rate of space inside the housing assembly 2.

In some embodiments, as shown in FIG. 3 and FIG. 5, in the flattened state, the bending part 32 includes a fourth convex portion 324, a fifth convex portion 325 and a sixth convex portion 326 arranged in sequence, the fifth convex portion 325 is arranged to protrude towards the first surface 23, and the fourth convex portion 324 and the sixth convex portion 326 are arranged to protrude away from the first surface 23. The second arc-shaped surface 222 abuts against part of the fourth convex portion 324 adjacent to the fifth convex portion 325 in the direction towards the first surface 23, and the fourth arc-shaped surface 51 abuts against part of the sixth convex portion 326 adjacent to the fifth convex portion 325 in the direction towards the first surface 23.

In some embodiments of the present disclosure, in the flattened state, the part of the fourth convex portion 324 adjacent to the fifth convex portion 325 and the part of the sixth convex portion 326 adjacent to the fifth convex portion 325 both have a restoring elastic force in the direction facing away from the first surface 23. By the second arc-shaped surface 222 abutting against the part of the fourth convex portion 324 adjacent to the fifth convex portion 325 in the direction towards the first surface 23, and by the fourth arc-shaped surface 51 abutting against the part of the sixth convex portion 326 adjacent to the fifth convex portion 325 in the direction towards the first surface 23, the bending part 32 can be bent according to the preset shape more easily, which is conducive to further reducing the risk of fracture failure of the flexible circuit board 3 and prolonging the service life of the foldable electronic device 100.

In addition, by arranging the fourth convex portion 324, the fifth convex portion 325 and the sixth convex portion 326, the bending part 32 is bent many times, so that the overall length of the bending part 32 is large in the limited space, that is, the redundant length of the flexible circuit board 3 is large, which is conducive to improving the utilization rate of space inside the housing assembly 2.

In some embodiments, as shown in FIG. 3 and FIG. 4, the first housing 21 further has a fifth arc-shaped surface 213. In the process of switching between the flattened state and the folded state, the part of the third convex portion 323 adjacent to the second convex portion 322 is clamped between the third arc-shaped surface 41 and the fifth arc-shaped surface 213. The fifth arc-shaped surface 213 is arranged on the side of the first housing 21 adjacent to the flexible circuit board 3.

Since the part of the third convex portion 323 adjacent to the second convex portion 322 is clamped between the third arc-shaped surface 41 and the fifth arc-shaped surface 213, on the one hand, the bending part 32 can be bent according to the preset shape more easily, which is conducive to further reducing the risk of fracture failure of the flexible circuit board 3 and prolonging the service life of the foldable electronic device 100, and on the other hand, the sealing between the first housing 21 and the first compressing member 4 can be achieved, thus avoiding water and the like from passing between the first housing 21 and the first compressing member 4 to enter the inside of the first housing 21, which is conducive to improving the waterproof performance of the foldable electronic device 100. In addition, in some embodiments of the present disclosure, the flexible circuit board 3 typically includes a plurality of layers of circuit board bodies arranged in a stack. In order to ensure the bending performance of the bending part 32, adjacent circuit board bodies at the bending part 32 can move relative to each other. The part of the third convex portion 323 adjacent to the second convex portion 322 is clamped between the third arc-shaped surface 41 and the fifth arc-shaped surface 213, which may also avoid a delamination phenomenon between the adjacent circuit board bodies in a bending process of the flexible circuit board 3, thus reducing the risk of an abnormal tapping noise being generated in the bending process of the flexible circuit board 3.

In some embodiments, as shown in FIG. 3 and FIG. 4, at least one of the third arc-shaped surface 41 and the fifth arc-shaped surface 213 is a convex arc-shaped surface arranged to protrude towards the bending part 32. In other words, the third arc-shaped surface 41 is a convex arc-shaped surface arranged to protrude towards the bending part 32, and the fifth arc-shaped surface 213 is a concave arc-shaped surface arranged to be depressed towards the bending part 32; or, the third arc-shaped surface 41 is a concave arc-shaped surface arranged to be depressed towards the bending part 32, and the fifth arc-shaped surface 213 is the convex arc-shaped surface arranged to protrude towards the bending part 32; or, the third arc-shaped surface 41 and the fifth arc-shaped surface 213 both are convex arc-shaped surfaces arranged to protrude towards the bending part 32. In some embodiments, the third arc-shaped surface 41 and the fifth arc-shaped surface 213 both are convex arc-shaped surfaces arranged to protrude towards the bending part 32.

By arranging at least one of the third arc-shaped surface 41 and the fifth arc-shaped surface 213 as the convex arc-shaped surface arranged to protrude towards the bending part 32, each part of the convex arc-shaped surface may apply a force in a direction towards the bending part to the bending part 32. Thus, in the process of the foldable electronic device 100 switching between the flattened state and the folded state, this further facilitates keeping the third arc-shaped surfaces 41 and the fifth arc-shaped surface 213 in a state of clamping the third convex portion 323, so that the sealing between the first housing 21 and the first compressing member 4 is more reliable, which is conducive to further improving the waterproof performance of the foldable electronic device 100.

In some embodiments, a curvature radius of the first arc-shaped surface 212 is greater than or equal to 0.5 mm, and/or, a curvature radius of the third arc-shaped surface 41 is greater than or equal to 0.5 mm, and/or, a curvature radius of the fifth arc-shaped surface 213 is greater than or equal to 1 mm. In some embodiments, the curvature radius of the first arc-shaped surface 212 is greater than or equal to 0.5 mm, the curvature radius of the third arc-shaped surface 41 is greater than or equal to 0.5 mm, and the curvature radius of the fifth arc-shaped surface 213 is greater than or equal to 1 mm.

Through the above design of the first arc-shaped surface 212, the third arc-shaped surface 41 and the fifth arc-shaped surface 213, the bending radius of part of the bending part 32 located inside the first housing 21 may be large, further prolonging the service life of the foldable electronic device 100.

In some embodiments, the first arc-shaped surface 212 is a convex arc-shaped surface arranged to protrude towards the bending part 32.

By arranging the first arc-shaped surface 212 as the convex arc-shaped surface arranged to protrude towards the bending part 32, in the process of the foldable electronic device 100 switching from the flattened state to the folded state, the first arc-shaped surface 212 may be in contact with the bending part 32 more easily, thus further facilitating guiding the bending part 32 to bend into the preset shape by the first arc-shaped surface 212.

In some embodiments, as shown in FIG. 3 and FIG. 5, the second housing 22 further has a sixth arc-shaped surface 223. In the process of switching between the flattened state and the folded state, part of the sixth convex portion 326 adjacent to the fifth convex portion 325 is clamped between the fourth arc-shaped surface 51 and the sixth arc-shaped surface 223. The sixth arc-shaped surface 223 is arranged on the side of the second housing 22 adjacent to the flexible circuit board 3.

Since the part of the sixth convex portion 326 adjacent to the fifth convex portion 325 is clamped between the fourth arc-shaped surface 51 and the sixth arc-shaped surface 223, on the one hand, the bending part 32 can be bent according to the preset shape more easily, which is conducive to further reducing the risk of fracture failure of the flexible circuit board 3 and prolonging the service life of the foldable electronic device 100, and on the other hand, the sealing between the second housing 22 and the second compressing member 5 may be achieved, thus avoiding water and the like from passing between the second housing 22 and the second compressing member 5 to enter the inside of the second housing 22, which is conducive to improving the waterproof performance of the foldable electronic device 100. In addition, in some embodiments of the present disclosure, the flexible circuit board 3 typically includes a plurality of layers of circuit board bodies arranged in a stack. In order to ensure the bending performance of the bending part 32, adjacent circuit board bodies at the bending part 32 can move relative to each other. The part of the sixth convex portion 326 adjacent to the fifth convex portion 325 is clamped between the fourth arc-shaped surface 51 and the sixth arc-shaped surface 223, which may also avoid the delamination phenomenon between the adjacent circuit board bodies in the bending process of the flexible circuit board 3, thus reducing the risk of an abnormal tapping noise being generated in the bending process of the flexible circuit board 3.

In some embodiments, as shown in FIG. 3 and FIG. 5, at least one of the fourth arc-shaped surface 51 and the sixth arc-shaped surface 223 is a convex arc-shaped surface arranged to protrude towards the bending part 32. In other words, the fourth arc-shaped surface 51 is a convex arc-shaped surface arranged to protrude towards the bending part 32, and the sixth arc-shaped surface 223 is a concave arc-shaped surface arranged to be depressed towards the bending part 32; or, the fourth arc-shaped surface 51 is a concave arc-shaped surface arranged to be depressed towards the bending part 32, and the sixth arc-shaped surface 223 is a convex arc-shaped surface arranged to protrude towards the bending part 32; or, the fourth arc-shaped surface 51 and the sixth arc-shaped surface 223 both are convex arc-shaped surfaces arranged to protrude towards the bending part 32. In some embodiments, the fourth arc-shaped surface 51 and the sixth arc-shaped surface 223 both are convex arc-shaped surfaces arranged to protrude towards the bending part 32.

By arranging at least one of the fourth arc-shaped surface 51 and the sixth arc-shaped surface 223 as the convex arc-shaped surface arranged to protrude towards the bending part 32, each part of the convex arc-shaped surface may apply a force in a direction towards the bending part to the bending part 32. Thus, in the process of the foldable electronic device 100 switching between the flattened state and the folded state, this further facilitates keeping the third arc-shaped surfaces 41 and the sixth arc-shaped surface 223 in a state of clamping the fourth convex portion 324, so that the sealing between the second housing 22 and the second compressing member 5 is more reliable, which is conducive to further improving the waterproof performance of the foldable electronic device 100.

In some embodiments, a curvature radius of the second arc-shaped surface 222 is greater than or equal to 0.5 mm, and/or, a curvature radius of the fourth arc-shaped surface 51 is greater than or equal to 0.5 mm, and/or, a curvature radius of the sixth arc-shaped surface 223 is greater than or equal to 1 mm. In some embodiments, the curvature radius of the second arc-shaped surface 222 is greater than or equal to 0.5 mm, the curvature radius of the fourth arc-shaped surface 51 is greater than or equal to 0.5 mm, and the curvature radius of the sixth arc-shaped surface 223 is greater than or equal to 1 mm.

Through the above design of the second arc-shaped surface 222, the fourth arc-shaped surface 51 and the sixth arc-shaped surface 223, the bending radius of part of the bending part 32 located inside the second housing 22 may be large, further prolonging the service life of the foldable electronic device 100.

In some embodiments, the second arc-shaped surface 222 is a convex arc-shaped surface arranged to protrude towards the bending part 32.

By arranging the second arc-shaped surface 222 as the convex arc-shaped surface arranged to protrude towards the bending part 32, in the process of the foldable electronic device 100 switching from the flattened state to the folded state, the second arc-shaped surface 222 can be in contact with the bending part 32 more easily, thus further facilitating guiding the bending part 32 to bend into the preset shape by the second arc-shaped surface 222.

In some embodiments, in the flattened state, a ratio of the curvature radius of any portion of the bending part 32 to a thickness of the bending part 32 is greater than or equal to 5.

Through the above design of the curvature radius of the bending part 32, the problem of the large local stress on the flexible circuit board 3 may be effectively alleviated, and the service life of the foldable electronic device 100 is further prolonged.

Figure 6:
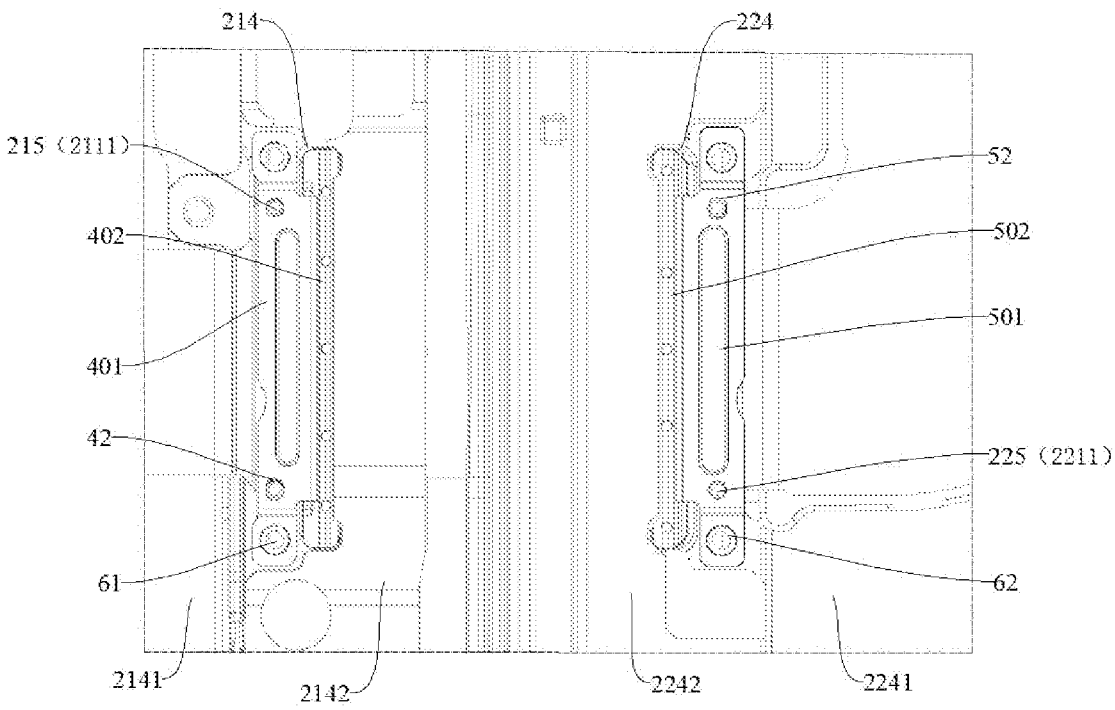
FIG. 6 is a top view of an electronic device according to an embodiment of the present disclosure (some parts not shown).

In some embodiments, as shown in FIG. 4 and FIG. 6, the first housing 21 has a first through hole 214 for the bending part 32 to pass through, one part of the first compressing member 4 is arranged outside the first through hole 214 and is connected with the first housing 21, and the other part of the first compressing member 4 is arranged inside the first through hole 214 and matches with the first through hole 214. The third arc-shaped surface 41 is arranged on the part of the first compressing member 4 located inside the first through hole 214.

Therefore, when connecting the first compressing member 4 to the first housing 21, one part of the first compressing member 4 may be placed inside the first through hole 214, and the pre-positioning of the first compressing member 4 is achieved as this part of the first compressing member 4 matches with the first through hole 214, and then the other part of the first compressing member 4 is connected with the first housing 21. This facilitates improving the convenience of connection between the first compressing member 4 and the first housing 21, and reducing the assembly cost of the foldable electronic device 100.

In some embodiments, as shown in FIG. 5 and FIG. 6, the second housing 22 has a second through hole 224 for the bending part 32 to pass through, one part of the second compressing member 5 is arranged outside the second through hole 224 and is connected with the second housing 22, and the other part of the second compressing member 5 is arranged inside the second through hole 224 and matches with the second through hole 224. The fourth arc-shaped surface 51 is arranged on the part of the second compressing member 5 located inside the second through hole 224.

Therefore, when connecting the second compressing member 5 to the second housing 22, one part of the second compressing member 5 may be placed in the second through hole 224, and the pre-positioning of the second compressing member 5 is achieved as this part of the second compressing member 5 matches with the second through hole 224, and then the other part of the second compressing member 5 is connected with the second housing 22. This facilitates improving the convenience of connection between the second compressing member 5 and the second housing 22, and reducing the assembly cost of the foldable electronic device 100.

In some embodiments, as shown in FIG. 4 and FIG. 7 to FIG. 9, the first compressing member 4 includes a first rigid part 401 and a first elastic part 402 connected with each other, the first rigid part 401 is connected with the first housing 21, and the first elastic part 402 is in interference fit with a wall defining the first through hole 214.

The first rigid part 401 is connected with the first housing 21, which is conducive to improving the reliability of the connection between the first compressing member 4 and the first housing 21. The interference fit between the first elastic part 402 and the wall defining the first through hole 214 may achieve the sealing on the first through hole 214, thus preventing water and the like from entering the inside of the first housing 21 through the first through hole 214, and facilitating improvement of the waterproof performance of the foldable electronic device 100.

In some embodiments, as shown in FIG. 5 and FIG. 7 to FIG. 9, the second compressing member 5 includes a second rigid part 501 and a second elastic part 502 connected with each other, the second rigid part 501 is connected with the second housing 22, and the second elastic part 502 is in interference fit with a wall defining the second through hole 224.

The second rigid part 501 is connected with the second housing 22, which is conducive to improving the reliability of the connection between the second compressing member 5 and the second housing 22. The interference fit between the second elastic part 502 and the wall defining the second through hole 224 may achieve the sealing on the second through hole 224, thus preventing water vapour and the like from entering the inside of the second housing 22 through the second through hole 224, and facilitating improvement the waterproof performance of the foldable electronic device 100.

Figure 8:
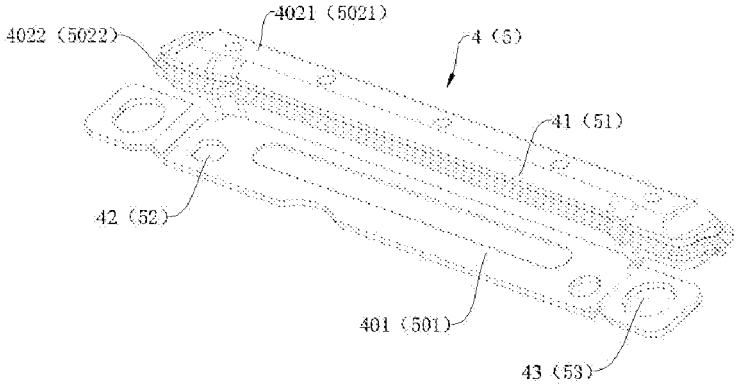
FIG. 8 is a schematic view of a first compressing member in FIG. 6 from another perspective, and also is a schematic view of a second compressing member from another perspective.

In some embodiments, as shown in FIG. 4, FIG. 5, and FIG. 8, the third arc-shaped surface 41 is arranged on the first elastic part 402.

By arranging the third arc-shaped surface 41 on the first elastic part 402, the third arc-shaped surface 41 is in elastic contact with the bending part 32, which may reduce the risk of collision of the flexible circuit board 3 in a assembly and bending process of the flexible circuit board 3, thus prolonging the service life of the flexible circuit board 3 and hence further prolonging the service life of the foldable electronic device 100.

In some embodiments, the fourth arc-shaped surface 51 is arranged on the second elastic part 502.

By arranging the fourth arc-shaped surface 51 on the second elastic part 502, the fourth arc-shaped surface 51 is in elastic contact with the bending part 32, which may reduce the risk of collision of the flexible circuit board 3 in the assembly and bending process of the flexible circuit board 3, thus prolonging the service life of the flexible circuit board 3 and hence further prolonging the service life of the foldable electronic device 100.

Figure 7:
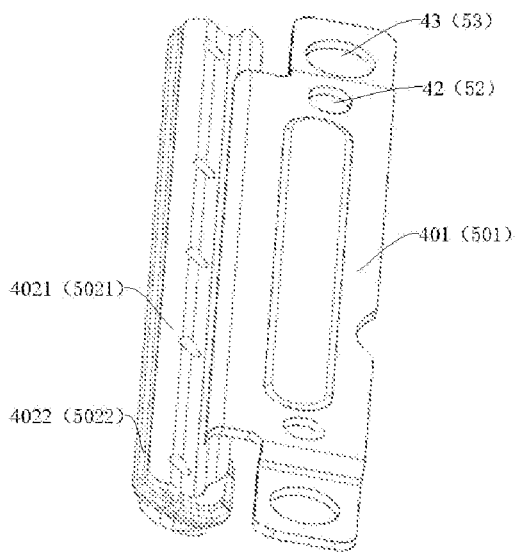
FIG. 7 is a schematic view of a first compressing member in FIG. 6 from a perspective, and also is a schematic view of a second compressing member in FIG. 6 from a perspective.
Figure 9:
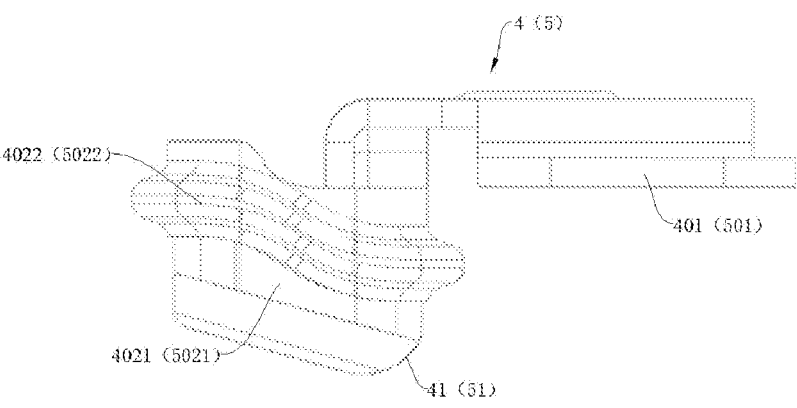
FIG. 9 is a front view of a first compressing member in FIG. 6, and also is a front view of a second compressing member in FIG. 6.

In some embodiments, as shown in FIG. 7 to FIG. 9, the first elastic part 402 includes a first main body portion 4021 and a first limiting rib 4022, the first main body portion 4021 is connected with the first rigid part 401, the first limiting rib 4022 is arranged around the first main body portion 4021, and the first limiting rib 4022 is in interference fit with the wall defining the first through hole 214.

The first limiting rib 4022 has greater elasticity and is more prone to elastic deformation than the first main body portion 4021. The interference fit between the first limiting rib 4022 and the wall defining the first through hole 214 is conducive to improving the sealing on the first through hole 214 and further enhancing the waterproof performance of the foldable electronic device 100.

In some embodiments, as shown in FIG. 7 to FIG. 9, the second elastic part 502 includes a second main body portion 5021 and a second limiting rib 5022, and the second main body portion 5021 is connected with the second rigid part 501, the second limiting rib 5022 is arranged around the second main body portion 5021, and the second limiting rib 5022 is in interference fit with the wall defining the second through hole 224.

The second limiting rib 5022 has greater elasticity and is more prone to elastic deformation than the second main body portion 5021. The interference fit between the second limiting rib 5022 and the wall defining the second through hole 224 is conducive to improving the sealing on the second through hole 224 and further enhancing the waterproof performance of the foldable electronic device 100.

In some embodiments, as shown in FIG. 4, the first rigid part 401 includes a first connecting portion and a first supporting portion, the first connecting portion is connected with the first housing 21, at least part of the first supporting portion extends into the first through hole 214, and the at least part of the first supporting portion is embedded inside the first elastic part 402. In some embodiments of the present disclosure, the at least part of the first supporting portion is inlaid inside the first elastic part 402, or in other words, the first elastic part 402 wraps the at least part of the first supporting portion. The first elastic part 402 may be fixed on the first supporting portion by hot pressing or vulcanization.

For example, as shown in FIG. 4, the first rigid part 401 includes a first fixed arm, a first connecting arm and a first cantilever connected in sequence, the first cantilever and the first fixed arm are parallel to each other and are arranged at intervals, and the first connecting arm is perpendicular to the first fixed arm. The first fixed arm is connected with the first housing 21, and the first connecting arm and the first cantilever extend into the first through hole 214 and are embedded inside the first elastic part 402.

Through the above design of the first rigid part 401, the reliability of the connection between the first rigid part 401 and the first elastic part 402 is improved, thus further enhancing the sealing reliability at the first through hole 214 and further enhancing the waterproof performance of the foldable electronic device 100.

In some embodiments, as shown in FIG. 5, the second rigid part 501 includes a second connecting portion and a second supporting portion, the second connecting portion is connected with the second housing 22, at least part of the second supporting portion extends into the second through hole 224, and the at least part of the second supporting portion is embedded inside the second elastic part 502. In some embodiments of the present disclosure, the at least part of the second supporting portion is inlaid inside the second elastic part 502, or in other words, the second elastic part 502 wraps the at least part of the second supporting portion. The second elastic part 502 may be fixed on the second supporting portion by hot pressing or vulcanization.

For example, as shown in FIG. 5, the second rigid part 501 includes a second fixed arm, a second connecting arm and a second cantilever connected in sequence, the second cantilever and the second fixed arm are parallel to each other and are arranged at intervals, and the second connecting arm is perpendicular to the second fixed arm. The second fixed arm is connected with the second housing 22, and the second connecting arm and the second cantilever extend into the second through hole 224 and are embedded inside the second elastic part 502.

Through the above design of the second rigid part 501, the reliability of the connection between the second rigid part 501 and the second elastic part 502 is improved, thus further enhancing the sealing reliability at the second through hole 224 and further enhancing the waterproof performance of the foldable electronic device 100. In some embodiments, the first rigid part 401 and the second rigid part 501 are steel sheets, and the first elastic part 402 and the second elastic part 502 are rubber members.

In some embodiments, as shown in FIG. 6 to FIG. 8, the first through hole 214 is an elongated hole, the first housing 21 includes a plurality of first positioning parts 215, the plurality of first positioning parts 215 are arranged at intervals along a length direction of the first through hole 214, and the first compressing member 4 includes a plurality of second positioning parts 42. The second positioning parts 42 have one-to-one correspondence with the first positioning parts 215, and each second positioning part 42 is positioned and fitted with a corresponding first positioning part 215. The elongated hole may be a waist-shaped hole.

For example, as shown in FIG. 6 to FIG. 8, the number of the first positioning parts 215 and the number of the second positioning part 42 each are two, and the two second positioning parts 42 are arranged on both sides of the first through hole 214 in its length direction, respectively.

When connecting the first compressing member 4 to the first housing 21, the second positioning part 42 is positioned and fitted with the corresponding first positioning part 215 to achieve the positioning between the first compressing member 4 and the first housing 21, which is conducive to, on the one hand, improving the convenience of the connection between the first compressing member 4 and the first housing 21, and on the other hand, improving the assembly accuracy between the first compressing member 4 and the first housing 21.

In some embodiments, the second through hole 224 is an elongated hole. The second housing 22 includes a plurality of third positioning parts 225, the plurality of third positioning parts 225 are arranged at intervals along a length direction of the second through hole 224, and the second compressing member 5 includes a plurality of fourth positioning parts 52. The fourth positioning parts 52 have one-to-one correspondence with the third positioning parts 225, and each fourth positioning part 52 is positioned and fitted with a corresponding third positioning part 225. The elongated hole may be a waist-shaped hole.

For example, as shown in FIG. 6 to FIG. 8, the number of the third positioning parts 225 and the number of the fourth positioning parts 52 each are two, and the two fourth positioning parts 52 are arranged on both sides of the second through hole 224 in its length direction, respectively.

When connecting the second compressing member 5 to the second housing 22, the fourth positioning part 52 is positioned and fitted with the corresponding third positioning part 225 to achieve the positioning between the second compressing member 5 and the second housing 22, which is conducive to, on the one hand, improving the convenience of the connection between the second compressing member 5 and the second housing 22, and on the other hand, improving the assembly accuracy between the second compressing member 5 and the second housing 22.

In some embodiments, as shown in FIG. 6 to FIG. 8, the first positioning part 215 is a first positioning column, and the first positioning column has a cylindrical shape. The second positioning part 42 is a first positioning hole, a part of the first positioning holes is a circular hole, and another part of the first positioning holes is an elongated hole.

For example, as shown in FIG. 7 and FIG. 8, one of the two second positioning parts 42 is a circular hole and the other one of the two second positioning parts 42 is an elongated hole. The elongated hole may be a waist-shaped hole.

By arranging the part of the first positioning holes as the elongated hole, when there is a large machining error between adjacent two second positioning parts 42, each first positioning column may also be positioned and fitted with the corresponding first positioning hole, thus improving the tolerance between the first compressing member 4 and the first housing 21.

In some embodiments, as shown in FIG. 6 to FIG. 8, the third positioning part 225 is a second positioning column, the second positioning column has a cylindrical shape, the fourth positioning part 52 is a second positioning hole, a part of the second positioning holes is a circular hole, and another part of the second positioning holes is an elongated hole.

For example, as shown in FIG. 7 and FIG. 8, one of the two fourth positioning parts 52 is a circular hole and the other one of the two fourth positioning parts 52 is an elongated hole. The elongated hole may be a waist-shaped hole.

By arranging the part of the second positioning holes as the elongated hole, when there is a large machining error between adjacent two fourth positioning parts 52, each second positioning column may also be positioned and fitted with the corresponding second positioning hole, thus improving the tolerance between the second compressing member 5 and the second housing 22.

In some embodiments, the first compressing member 4 is detachably connected with the first housing 21.

For example, as shown in FIG. 6 to FIG. 8, the first compressing member 4 is detachably connected with the first housing 21 by a first screw 61. Specifically, the first compressing member 4 has a first connecting hole 43, the first housing 21 has a first threaded hole, and the first screw 61 passes through the first connecting hole 43 and is threadedly connected with the first threaded hole.

The first compressing member 4 is detachably connected with the first housing 21, which facilitates the maintenance and replacement of the first compressing member 4, and is conducive to improving the maintenance convenience of the foldable electronic device 100.

In some embodiments, the second compressing member 5 is detachably connected with the second housing 22.

For example, as shown in FIG. 6 to FIG. 8, the second compressing member 5 is detachably connected with the second housing 22 by a second screw 62. Specifically, the second compressing member 5 has a second connecting hole 53, the second housing 22 has a second threaded hole, and the second screw 62 passes through the second connecting hole 53 and is threadedly connected with the second threaded hole.

The second compressing member 5 is detachably connected with the second housing 22, which facilitates the maintenance and replacement of the second compressing member 5, and is conducive to improving the maintenance convenience of the foldable electronic device 100.

In some embodiments, as shown in FIG. 4, the first housing 21 includes a first portion 2141 and a second portion 2142 arranged opposite to each other in a width direction of the first through hole 214, part of the first compressing member 4 is connected with the first portion 2141, the second portion 2142 includes a first stopping part 2143 on a side away from the bending part 32, and the first stopping part 2143 is configured to stop the first compressing member 4.

In some embodiments of the present disclosure, when the part of the first compressing member 4 is connected with the first portion 2141 and the third arc-shaped surface 41 of the first compressing member 4 abuts against the bending part 32, the bending part 32 will apply a reaction force on the first compressing member 4, which causes the part of the first compressing member 4 located inside the first through hole 214 to tilt, thus affecting the sealing of the first compressing member 4 on the first through hole 214 and the reliability of the first compressing part 4 abutting against the bending part 32.

By arranging the first stopping part 2143 on the side of the second portion 2142 away from the bending part 32, the first stopping part 2143 is configured to stop the first compressing part 4, which may effectively prevent the part of the first compressing part 4 located inside the first through hole 214 from tilting, and ensure the sealing of the first compressing part 4 on the first through hole 214 and the reliability of the first compressing part 4 abutting against the bending part 32. In addition, when connecting the first compressing member 4 with the first housing 21, the first stopping part 2143 may stop and be fitted with one part of the first compressing member 4, and then the other part of the first compressing member 4 is connected with the first housing 21, which is conducive to improving the assembly convenience of the first compressing member 4.

In some embodiments, the second housing 22 includes a third portion 2241 and a fourth portion 2242 arranged opposite to each other in a width direction of the second through hole 224, part of the second compressing member 5 is connected with the third portion 2241, the fourth portion 2242 includes a second stopping part 2243 on a side away from the bending part 32, and the second stopping part 2243 is configured to stop the second compressing member 5.

In some embodiments of the present disclosure, when the part of the second compressing member 5 is connected with the third portion 2241 and the fourth arc-shaped surface 51 of the second compressing member 5 abuts against the bending part 32, the bending part 32 will apply a reaction force on the second compressing member 5, which causes the part of the second compressing member 5 located inside the second through hole 224 to tilt, thus affecting the sealing of the second compressing member 5 on the second through hole 224 and the reliability of the second compressing member 5 abutting against the bending part 32.

By arranging the second stopping part 2243 on the side of the second portion 2142 away from the bending part 32, the second stopping part 2243 is configured to stop the second compressing part 5, which can effectively prevent the part of the second compressing part 5 located inside the second through hole 224 from tilting, and ensure the sealing of the second compressing part 5 on the second through hole 224 and the reliability of the second compressing member 5 abutting against the bending part 32. In addition, when connecting the second compressing member 5 with the second housing 22, the second stopping part 2243 may stop and be fitted with one part of the second compressing member 5, and then the other part of the second compressing member 5 is connected with the second housing 22, which is conducive to improving the assembly convenience of the second compressing member 5.

In some embodiments, the first stopping part 2143 is plate-shaped, and a surface of the first elastic part 402 away from the bending part 32 is fitted with a surface of the first stopping part 2143 adjacent to the bending part 32.

The first elastic part 402 is fitted with the first stopping part 2143 to further improve the sealing on the first through hole 214, thus further enhancing the waterproof performance of the foldable electronic device 100.

The second stopping part 2243 is plate-shaped, and a surface of the second elastic part 502 away from the bending part 32 is fitted with a surface of the second stopping part 2243 adjacent to the bending part 32.

The second elastic part 502 is fitted with the second stopping part 2243 to further improve the sealing on the second through hole 224, thus further enhancing the water-proof performance of the foldable electronic device 100.

The flexible circuit board 3 of the foldable electronic device 100 according to the embodiment of the present disclosure has a bending life which has passed a level 100 verification for 20W (i.e. 200,000) times without failure, a level 20 verification for 40W (i.e. 400,000) times without failure, and a level 10 verification for 50W (i.e. 500,000) times without failure. In the process of the foldable electronic device 100 switching from the folded state to the unfolded state, there is no abnormal noise in the folding process of the flexible circuit board 3. The housing assembly 2 and the compressing members (the first compressing member 4 and the second compressing member 5) work together, to achieve the installation and fixation of the compressing members, thus avoiding labor waste and improving assembly efficiency.

In some embodiments of the present disclosure, in the structure shown in FIG. 1 to FIG. 6, the bending part 32 of the flexible circuit board 3 is a symmetrical structure, that is, a first portion of the bending part 32 is arranged corresponding to the first housing 21, a second portion of the bending part 32 is arranged corresponding to the second housing 22, and the first portion and the second portion of the bending part 32 are symmetrical about the rotation shaft 1. Each of the first housing 21 and the second housing 22 includes the arc-shaped surface for guiding the bending part 32 to bend, and each of the first compressing member 4 connected with the first housing 21 and the second compressing member 5 connected with the second housing 22 includes the arc-shaped surface for guiding the bending part 32 to bend. In other embodiments, the bending part 32 may also be an asymmetric structure. For example, only the first housing 21 includes the arc-shaped surface for guiding the bending part 32 to bend, and also the first compressing member 4 includes the arc-shaped surface for guiding the bending part 32 to bend, while as for the structure of the second housing 22 and the structure of the second compressing member 5 connected to the second housing 22, structures in the related art may be adopted. Or, only the second housing 22 includes the arc-shaped surface for guiding the bending part 32 to bend, and also the second compressing member 5 includes the arc-shaped surface for guiding the bending part 32 to bend, while as for the structure of the first housing 21 and the structure of the first compressing member 4 connected to the first housing 21, the structures in the related art may be adopted.

Embodiment 2

The difference between the foldable electronic device 100 according to this embodiment of the present disclosure and that in embodiment 1 described above is only in that: the first housing 21 does not include the first arc-shaped surface 212 and the fifth arc-shaped surface 213, the second housing 22 does not include the second arc-shaped surface 222 and the sixth arc-shaped surface 223, and only the compressing member includes the arc-shaped surface. In the process of switching from the folded state to the flattened state, only the arc-shaped surface on the compressing member is configured to guide the bending part 32 to bend into the preset shape.

Specifically, the foldable electronic device 100 includes the rotation shaft 1, the housing assembly 2 and the flexible circuit board 3, the housing assembly 2 includes the first housing 21 and the second housing 22, and the first housing 21 and the second housing 22 are rotatably connected to both sides of the rotation shaft 1, respectively, so that the foldable electronic device 100 can switch between the flattened state and the folded state. The flexible circuit board 3 includes the bendable bending part 32.

The foldable electronic device 100 further includes the first compressing member 4, the first compressing member 4 is connected with the first housing 21, the first compressing member 4 has the third arc-shaped surface 41, and in the process of switching from the folded state to the flattened state, the third arc-shaped surface 41 abuts against the bending part 32 to guide the bending part 32 to bend into the preset shape; and/or, the foldable electronic device 100 further includes the second compressing member 5, the second compressing member 5 is connected with the second housing 22, the second compressing member 5 has the fourth arc-shaped surface 51, and in the process of switching from the folded state to the flattened state, the fourth arc-shaped surface 51 abuts against the bending part 32 to guide the bending part 32 to bend into the preset shape.

In addition, in the foldable electronic device in the related art, the flexible circuit board typically includes a plurality of layers of circuit board bodies arranged in a stack, and adjacent two layers of circuit board bodies are bonded by an adhesive at the fixed part, to improve the stiffness of the fixed part, thus facilitating the connection between the fixed part and the housing. Moreover, a fixed frame (such as a fixed steel sheet) is typically glued at the fixed part by an adhesive, to further improve the stiffness of the fixed part. This results in a large stiffness of an edge of the bending part, that is, the stiffness of part of the bending part adjacent to the fixed part is large, which results in a large stress on the edge of the bending part in the bending process thereof, thus resulting in the problem that the flexible circuit board is prone to fracture failure, and affecting the service life of the foldable electronic device. In addition, since the adjacent two layers of circuit board bodies are bonded by the adhesive at the fixed part, and the fixed part and the fixed frame are bonded by the adhesive, the adhesive for bonding is prone to overflow to the edge of the bending part, thus further increasing the stress on the edge of the bending part in the bending process of the bending part, and hence further increasing the risk of fracture failure of the flexible circuit board.

In the foldable electronic device according to the embodiment of the present disclosure, the fixed part of the flexible circuit board is innovatively designed, so that the fixed part includes a portion with a large stiffness and a portion with a small stiffness. The portion with the large stiffness facilitates the positioning and fixation between the flexible circuit board and the housing, and the stiffness of the edge of the bending part corresponding to the portion with the small stiffness will also be small, thus reducing the stress on the edge of the bending part in the bending process of the bending part, reducing the risk of fracture failure of the flexible circuit board, and prolonging the service life of the foldable electronic device.

Embodiment 3

As shown in FIG. 3 to FIG. 5 and FIG. 10 to FIG. 15, the foldable electronic device 100 according to the embodiment of the present disclosure includes the rotation shaft 1, the housing assembly 2 and the flexible circuit board 3, the housing assembly 2 includes the first housing 21 and the second housing 22, and the first housing 21 and the second housing 22 are rotatably connected to both sides of the rotation shaft 1, respectively, so that the foldable electronic device 100 can switch between the flattened state and the folded state. The flexible circuit board 3 includes the plurality of layers of circuit board bodies arranged in a stack.

The first housing 21 has the first mounting part 211, the flexible circuit board 3 includes the first fixed part 31 and the bendable bending part 32 arranged in sequence, and the first fixed part 31 is connected with the first mounting part 211. The first fixed part 31 includes a first adhesive portion 311 and a first non-adhesive portion 312, the adjacent two layers of circuit board bodies are bonded at the first adhesive portion 311, and the adjacent two layers of circuit board bodies can move relative to each other at the first non-adhesive portion 312. And/or, the second housing 22 has the second mounting part 221, the flexible circuit board 3 includes the bendable bending part 32 and the second fixed part 33 arranged in sequence, and the second fixed part 33 is connected with the second mounting part 221. The second fixed part 33 includes a second adhesive portion 331 and a second non-adhesive portion 332, the adjacent two layers of circuit board bodies are bonded at the second adhesive portion 331, and the adjacent two layers of circuit board bodies can move relative to each other at the second non-adhesive portion 332.

In the foldable electronic device 100 according to the embodiment the present disclosure, the folding and unfolding may be achieved by rotating the first housing 21 and the second housing 22 relative to the rotation shaft 1. The first fixed part 31 of the flexible circuit board 3 is connected with the first mounting part 211 of the first housing 21, to achieve the connection between the flexible circuit board 3 and the first housing 21, so that when the first housing 21 rotates relative to the rotation shaft 1, the first fixed part 31 may be moved with the first housing 21 by bending of the bending part 32. The second fixed part 33 of the flexible circuit board 3 is connected with the second mounting part 221 of the second housing 22, to achieve the connection between the flexible circuit board 3 and the second housing 22, so that when the second housing 22 rotates relative to the rotation shaft 1, the second fixed part 33 may be moved with the second housing 22 by bending of the bending part 32.

The adjacent two layers of circuit board bodies can move relative to each other at the first non-adhesive portion 312. In some embodiments of the present disclosure, the adjacent two layers of circuit board bodies are not connected at the first non-adhesive portion 312. The adjacent two layers of circuit board bodies are not connected at the first non-adhesive portion 312, so that there is a gap between the adjacent two layers of circuit board bodies at the first non-adhesive portion 312, which is softer and more prone to bend. The adjacent two layers of circuit board bodies can move relative to each other at the second non-adhesive portion 332. In some embodiments of the present disclosure, the adjacent two layers of circuit board bodies are not connected at the second non-adhesive portion 332. The adjacent two layers of circuit board bodies are not connected at the second non-adhesive portion 332, so that there is a gap between the adjacent two layers of circuit board bodies at the second non-adhesive portion 332, which is softer and more prone to bend.

When the bending part 32 is bent, the adjacent two layers of circuit board bodies are bonded at the first adhesive portion 311, and the adjacent two layers of circuit board bodies can move relative to each other at the first non-adhesive portion 312. On the one hand, the stiffness of the first fixed part 31 at the first adhesive portion 311 is large, which may facilitate the connection between the first fixed part 31 and the first housing 21. On the other hand, the stiffness of the first fixed part 31 at the first non-adhesive portion 312 is small, which thus may reduce the stiffness of the edge of the bending part 32 corresponding to the first non-adhesive portion 312, thus reducing the stress on the edge of the bending part 32 in the bending process of the bending part 32, reducing the risk of fracture failure of the flexible circuit board 3, and prolonging the service life of the foldable electronic device 100.

When the bending part 32 is bent, the adjacent two layers of circuit board bodies are bonded at the second adhesive portion 331, and the adjacent two layers of circuit board bodies can move relative to each other at the second non-adhesive portion 332. On the one hand, the stiffness of the second fixed part 33 at the second adhesive portion 331 is large, which may facilitate the connection between the second fixed part 33 and the second housing 22. On the other hand, the stiffness of the second fixed part 33 at the second non-adhesive portion 332 is small, which thus may reduce the stiffness of the edge of the bending part 32 corresponding to the second non-adhesive portion 332, further reducing the stress on the edge of the bending part 32 in the bending process of the bending part 32, reducing the risk of fracture failure of the flexible circuit board 3, and prolonging the service life of the foldable electronic device 100.

In some embodiments, the first adhesive portion 311 is connected with the first mounting part 211, and the first non-adhesive portion 312 and the first mounting part 211 can move relative to each other.

When the bending part 32 is bent, the first non-adhesive portion 312 and the first mounting part 211 can move relative to each other, which is conducive to further reducing the stiffness of the first fixed part 31 at the first non-adhesive portion 312, and thus further reducing the stiffness of the edge of the bending part 32 corresponding to the first non-adhesive portion 312, thus reducing the stress on the edge of the bending part 32 in the bending process of the bending part 32, reducing the risk of fracture failure of the flexible circuit board 3, and prolonging the service life of the foldable electronic device 100.

In some embodiments, the second adhesive portion 331 is connected with the second mounting part 221, and the second non-adhesive portion 332 and the second mounting part 221 can move relative to each other.

When the bending part 32 is bent, the second non-adhesive portion 332 and the second mounting part 221 can move relative to each other, which is conducive to further reducing the stiffness of the second fixed part 33 at the second non-adhesive portion 332, and thus further reducing the stiffness of the edge of the bending part 32 corresponding to the second non-adhesive portion 332, thus reducing the stress on the edge of the bending part 32 in the bending process of the bending part 32, reducing the risk of fracture failure of the flexible circuit board 3, and prolonging the service life of the foldable electronic device 100.

Figure 10:
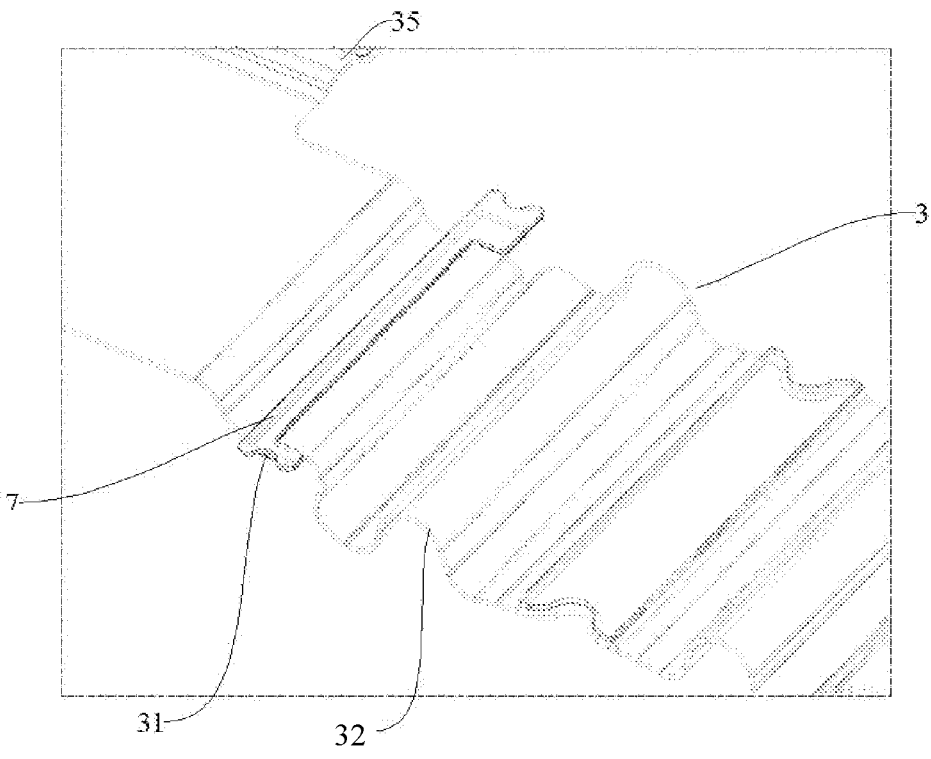
FIG. 10 is a perspective view of a flexible circuit board of an electronic device according to an embodiment of the present disclosure.
Figure 11:
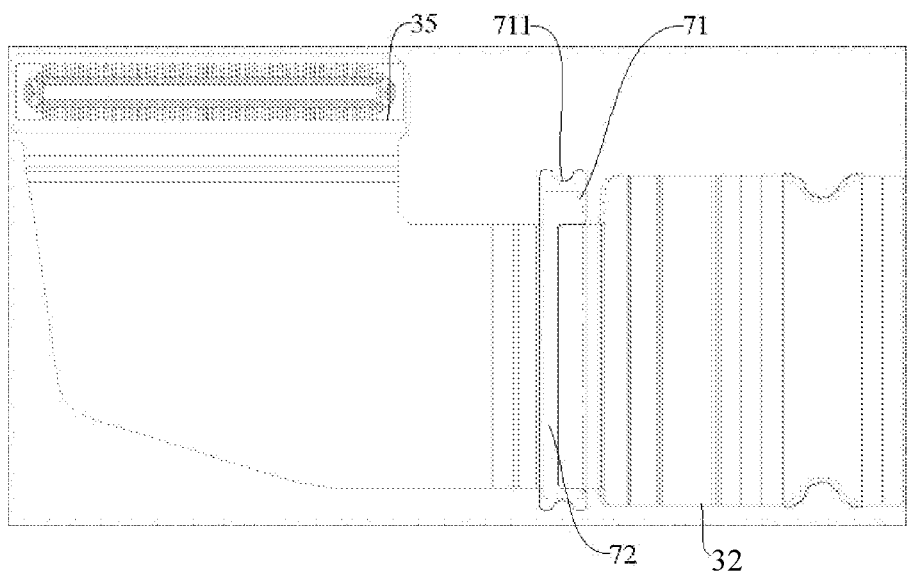
FIG. 11 is a top view of a flexible circuit board of an electronic device according to an embodiment of the present disclosure.
Figure 13:
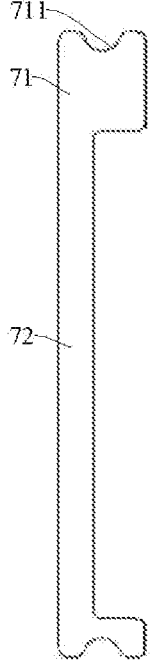
FIG. 13 is a schematic view of a first fixed frame in FIG. 11.
Figure 14:
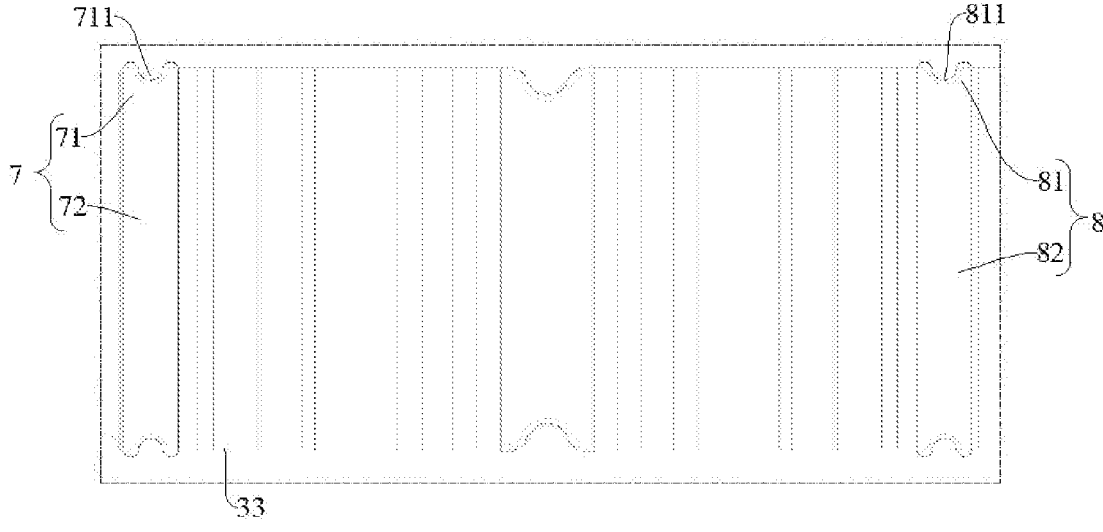
FIG. 14 is a top view of a flexible circuit board of an electronic device according to another embodiment of the present disclosure.

In some embodiments, as shown in FIG. 4, FIG. 5, FIG. 10, FIG. 11, and FIG. 14, the foldable electronic device 100 further includes a first fixed frame 7, and the first fixed frame 7 is connected with the first fixed part 31. As shown in FIG. 11, FIG. 13, and FIG. 14, the first fixed frame 7 includes a third adhesive portion 71 and a third non-adhesive portion 72. The third adhesive portion 71 is arranged corresponding to the first adhesive portion 311 and is bonded with the first adhesive portion 311, and the third non-adhesive portion 72 is arranged corresponding to the first non-adhesive portion 312 and can move relative to the first non-adhesive portion 312.

The third non-adhesive portion 72 can move relative to the first non-adhesive portion 312. In some embodiments of the present disclosure, the third non-adhesive portion 72 is not connected with the first non-adhesive portion 312. The third non-adhesive portion 72 is not connected with the first non-adhesive portion 312, so that there is a gap between the third non-adhesive portion 72 and the first non-adhesive portion 312, and thus the first non-adhesive portion 312 is softer and more prone to bend.

The third adhesive portion 71 is arranged corresponding to the first adhesive portion 311 and is bonded with the first adhesive portion 311, which may increase the stiffness of the first fixed part 31 at the first adhesive portion 311 and improve the convenience of connection between the first fixed part 31 and the first housing 21. The third non-adhesive portion 72 is arranged corresponding to the first non-adhesive portion 312 and can move relative to the first non-adhesive portion 312, so that the first non-adhesive portion 312 of the first fixed part 31 maintains a small stiffness, and when the bending part 32 is bent, this reduces the risk of fracture failure of the flexible circuit board 3 and prolongs the service life of the foldable electronic device 100.

Figure 15:
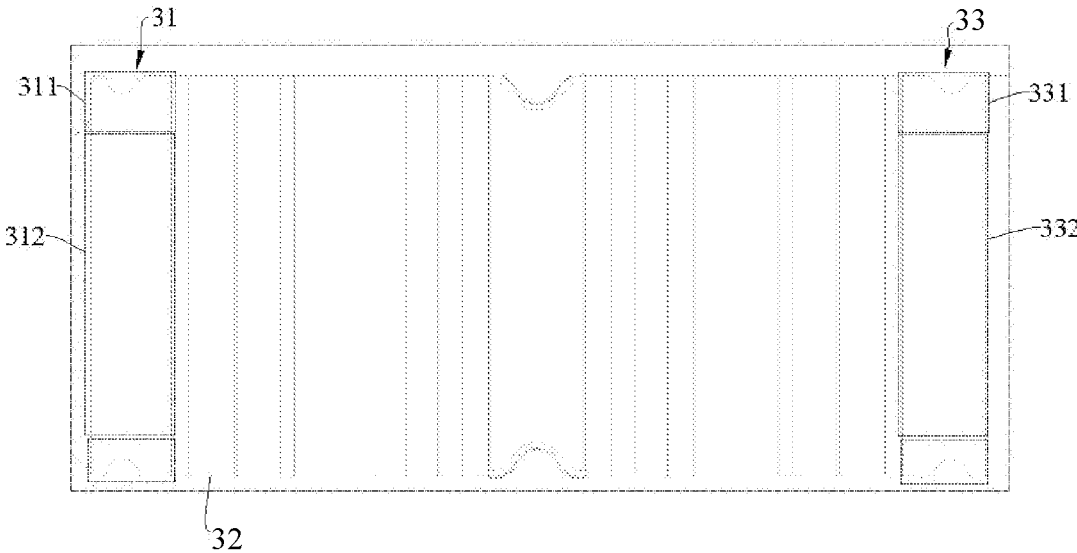
FIG. 15 is a schematic view of a structure in which a first fixed frame and a second fixed frame are hidden in FIG. 14.

As shown in FIG. 4, FIG. 5, FIG. 10, FIG. 11, and FIG. 14, the foldable electronic device 100 further includes a second fixed frame 8, and the second fixed frame 8 is connected with the second fixed part 33. As shown in FIG. 14 and FIG. 15, the second fixed frame 8 includes a fourth adhesive portion 81 and a fourth non-adhesive portion 82. The fourth adhesive portion 81 is arranged corresponding to the second adhesive portion 331 and is bonded with the second adhesive portion 331, and the fourth non-adhesive portion 82 is arranged corresponding to the second non-adhesive portion 332 and can move relative to the second non-adhesive portion 332.

The fourth non-adhesive portion 82 can move relative to the second non-adhesive portion 332. In some embodiments of the present disclosure, the fourth non-adhesive portion 82 is not connected with the second non-adhesive portion 332. The fourth non-adhesive portion 82 is not connected with the second non-adhesive portion 332, so that there is a gap between the fourth non-adhesive portion 82 and the second non-adhesive portion 332, and thus the second non-adhesive portion 332 is softer and more prone to bend.

The fourth adhesive portion 81 is arranged corresponding to the second adhesive portion 331 and is bonded with the second adhesive portion 331, which may increase the stiffness of the second fixed part 33 at the second adhesive portion 331 and improve the convenience of connection between the second fixed part 33 and the first housing 21. The fourth non-adhesive portion 82 is arranged corresponding to the second non-adhesive portion 332 and can move relative to the second non-adhesive portion 332, so that the second non-adhesive portion 332 of the second fixed part 33 maintains a small stiffness, and when the bending part 32 is bent, this reduces the risk of fracture failure of the flexible circuit board 3 and prolongs the service life of the foldable electronic device 100.

Figure 12:
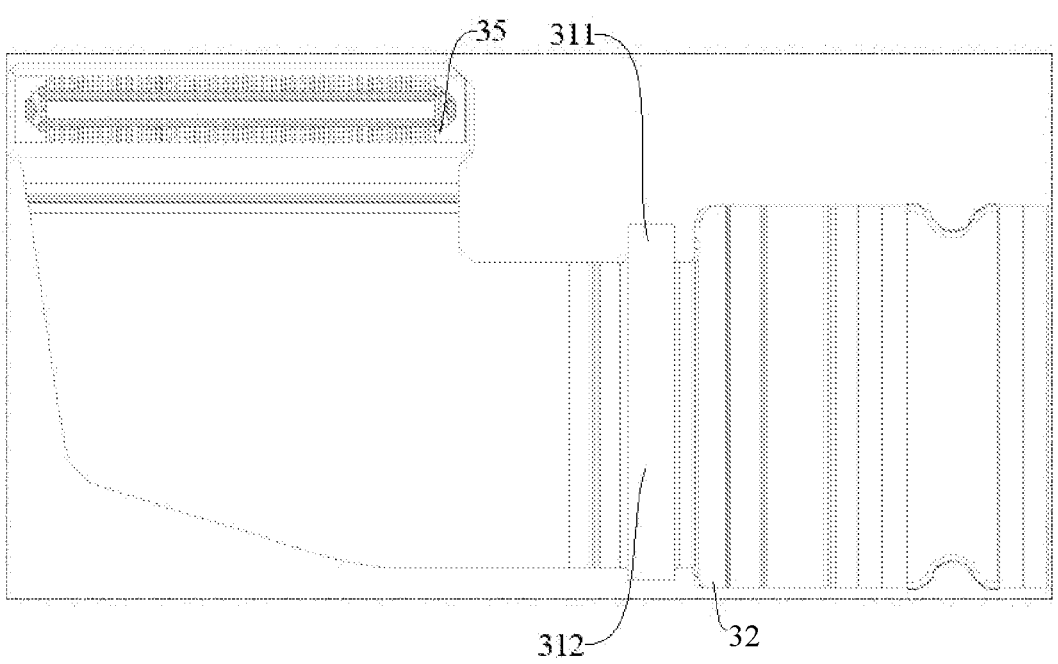
FIG. 12 is a schematic view of a structure in which a first fixed frame is hidden in FIG. 11.

In some embodiments, as shown in FIG. 12 and FIG. 15, the first fixed part 31 has an elongated shape, and the first adhesive portion 311 is arranged on either side of the first non-adhesive portion 312 in a length direction of the first fixed part 31.

Therefore, even if the adhesive overflows at the first adhesive portion 311, at least part of the adhesive may also overflow to an outer side of the flexible circuit board 3, for example, may overflow to a side of the first adhesive portion 311 away from the first non-adhesive portion 312 in the length direction of the first fixed part 31, so as to reduce the risk of the adhesive overflowing towards the bending part 32, and reduce the stiffness of the edge of the bending part 32 corresponding to the first adhesive portion 311, thus further reducing the risk of fracture failure of the flexible circuit board 3 and prolonging the service life of the foldable electronic device 100.

In some embodiments, as shown in FIG. 15, the second fixed part 33 has an elongated shape, and the second adhesive portion 331 is arranged on either side of the second non-adhesive portion 332 in a length direction of the second fixed part 33.

Therefore, even if the adhesive overflows at the second adhesive portion 331, at least part of the adhesive may also overflow to the outer side of the flexible circuit board 3, for example, may overflow to a side of the second adhesive portion 331 away from the second non-adhesive portion 332 in the length direction of the second fixed part 33, so as to reduce the risk of the adhesive overflowing towards the bending part 32, and reduce the stiffness of the edge of the bending part 32 corresponding to the second adhesive portion 331, thus further reducing the risk of fracture failure of the flexible circuit board 3 and prolonging the service life of the foldable electronic device 100.

In some embodiments, as shown in FIG. 12, the first fixed part 31 includes a first protrusion arranged to protrude beyond the bending part 32 in the length direction of the first fixed part 31, and the first protrusion forms the first adhesive portion 311.

The first adhesive portion 311 is arranged to protrude beyond the bending part 32, so that the first adhesive portion 311 and the bending part 32 are staggered, that is, the part of the first fixed part 31 corresponding to the bending part 32 is only the first non-adhesive portion 312. Thus, only the first non-adhesive portion 312 influences the stiffness of the edge of the bending part 32, and since the stiffness of the first fixed part 31 at the first non-adhesive portion 312 is small, the stress on the edge of the bending part 32 in the bending process of the bending part 32 is small, which is conducive to further reducing the risk of fracture failure of the flexible circuit board 3 and prolonging the service life of the foldable electronic device 100.

In some embodiments, the second fixed part 33 includes a second protrusion arranged to protrude beyond the bending part 32 in the length direction of the second fixed part 33, and the second protrusion forms the second adhesive portion 331.

The second adhesive portion 331 is arranged to protrude beyond the bending part 32, so that the second adhesive portion 331 and the bending part 32 are staggered, that is, the part of the second fixed part 33 corresponding to the bending part 32 is only the second non-adhesive portion 332. Thus, only the second non-adhesive portion 332 influences the stiffness of the edge of the bending part 32, and since the stiffness of the second fixed part 33 at the second non-adhesive portion 332 is small, the stress on the edge of the bending part 32 in the bending process of the bending part 32 is small, which is conducive to further reducing the risk of fracture failure of the flexible circuit board 3 and prolonging the service life of the foldable electronic device 100.

In some embodiments, as shown in FIG. 11 and FIG. 13, a width of the third adhesive portion 71 is greater than a width of the third non-adhesive portion 72. Correspondingly, a width of the first adhesive portion 311 is greater than a width of the first non-adhesive portion 312.

The third adhesive portion 71 needs to be bonded with the first adhesive portion 311, while the third non-adhesive portion 72 does not need to be connected with the flexible circuit board 3. In fact, the third non-adhesive portion 72 mainly plays a role in improving the overall stiffness of the first fixed frame 7. Therefore, by arranging the width of the third adhesive portion 71 to be greater than the width of the third non-adhesive portion 72, the amount of the overall material of the first fixed frame 7 may be reduced, while ensuring the reliability of the connection between the third adhesive portion 71 and the first adhesive portion 311, which is conducive to reducing the cost of the foldable electronic device 100.

In some embodiments, a width of the fourth adhesive portion 81 is greater than a width of the fourth non-adhesive portion 82. Correspondingly, a width of the second adhesive portion 331 is greater than a width of the second non-adhesive portion 332.

The fourth adhesive portion 81 needs to be bonded with the second adhesive portion 331, while the fourth non-adhesive portion 82 does not need to be connected with the flexible circuit board 3. In fact, the fourth non-adhesive portion 82 mainly plays a role in improving the overall stiffness of the second fixed frame 8. Therefore, by arranging the width of the third adhesive portion 71 to be greater than the width of the fourth non-adhesive portion 82, the amount of the overall material of the second fixed frame 8 may be reduced, while ensuring the reliability of the connection between the fourth adhesive portion 81 and the second adhesive portion 331, which is conducive to reducing the cost of the foldable electronic device 100.

In some embodiments, as shown in FIG. 11, the third non-adhesive portion 72 inclines to a side of the third adhesive portion 71 away from the bending part 32, i.e. the third non-adhesive portion 72 is located at the side of the third adhesive portion 71 away from the bending part 32.

With the third non-adhesive portion 72 inclining to the side of the third adhesive portion 71 away from the bending part 32, a distance between the third non-adhesive portion 72 and the bending part 32 is large. Thus, in the bending process of the bending part 32, the third non-adhesive portion 72 may be prevented from compressing the edge of the bending part 32, which otherwise will result in a great stress on the edge of the bending part 32, thus further reducing the risk of fracture failure of the flexible circuit board 3 and prolonging the service life of the foldable electronic device 100.

In some embodiments, the fourth non-adhesive portion 82 inclines to a side of the fourth adhesive portion 81 away from the bending part 32, i.e. the fourth non-adhesive portion 82 is located at the side of the fourth adhesive portion 81 away from the bending part 32.

With the fourth non-adhesive portion 82 inclining to the side of the fourth adhesive portion 81 away from the bending part 32, a distance between the fourth non-adhesive portion 82 and the bending part 32 is large. Thus, in the bending process of the bending part 32, the fourth non-adhesive portion 82 may be prevented from compressing the edge of the bending part 32, which otherwise will result in a great stress on the edge of the bending part 32, thus further reducing the risk of fracture failure of the flexible circuit board 3 and prolonging the service life of the foldable electronic device 100.

In some embodiments, as shown in FIG. 10, FIG. 11, and FIG. 13, the first fixed frame 7 is U-shaped.

By arranging the first fixed frame 7 to be U-shaped, it is convenient for the processing and manufacturing of the first fixed frame 7, which is conducive to further reducing the cost of the foldable electronic device 100.

In some embodiments, as shown in FIG. 10, FIG. 11, and FIG. 13, the second fixed frame 8 is U-shaped.

By arranging the second fixed frame 8 to be U-shaped, it is convenient for the processing and manufacturing of the second fixed frame 8, which is conducive to further reducing the cost of the foldable electronic device 100.

In some embodiments, the flexible circuit board 3 further includes an electrical connection part 35 for connecting with a printed circuit board, and the electrical connection part 35 and one of the third adhesive portions 71 are arranged on a same side of the third non-adhesive portion 72 in the length direction of the first fixed part 31. In the length direction of the first fixed part 31, a size of the third adhesive portion 71 arranged adjacent to the electrical connection part 35 is greater than a size of the third adhesive portion 71 arranged away from the electrical connection part 35. Correspondingly, in the length direction of the first fixed part 31, a size of the first adhesive portion 311 arranged adjacent to the electrical connection part 35 is greater than a size of the first adhesive portion 311 arranged away from the electrical connection part 35.

In some embodiments of the present disclosure, the force applied at the first adhesive portion 311 of the flexible circuit board 3 arranged adjacent to the electrical connection part 35 is usually large. In the length direction of the first fixed part 31, the size of the third adhesive portion 71 arranged adjacent to the electrical connection part 35 is greater than the size of the third adhesive portion 71 arranged away from the electrical connection part 35, so that a connection area between the first adhesive portion 311 arranged adjacent to the electrical connection part 35 and the first housing 21 is large, which is conducive to improving the reliability of the connection between the first fixed part 31 and the first housing 21.

In some embodiments, as shown in FIG. 6, FIG. 11, FIG. 13, and FIG. 14, the first mounting part 211 has a plurality of first limiting members 2111, the third adhesive portion 71 has a plurality of second limiting members 711, the plurality of second limiting members 711 have one-to-one correspondence with the plurality of first limiting members 2111, and each second limiting member 711 is positioned and fitted with a corresponding first limiting member 2111.

For example, the number of the first limiting members 2111 and the number of the second limiting members 711 each are two, and the two second limiting members 711 are arranged on both sides of the first fixed frame 7, respectively.

Due to the bonding between the third adhesive portion 71 and the first adhesive portion 311, when connecting the first fixed part 31 with the first housing 21, the second limiting member 711 is configured to be positioned and fitted with the first limiting member 2111, so as to achieve the positioning between the first fixed part 31 and the first housing 21, which is conducive to, on the one hand, improving the convenience of the connection between the first fixed part 31 and the first housing 21, and on the other hand, improving the assembly accuracy between the first fixed part 31 and the first housing 21.

In some embodiments, as shown in FIG. 6 and FIG. 14, the second mounting part 221 has a plurality of third limiting members 2211, the fourth adhesive portion 81 has a plurality of fourth limiting members 811, the plurality of fourth limiting members 811 have one-to-one correspondence with the plurality of third limiting members 2211, and each fourth limiting member 811 is positioned and fitted with a corresponding third limiting member 2211.

For example, the number of the third limiting members 2211 and the number of the fourth limiting members 811 each are two, and the two fourth limiting members 811 are arranged on both sides of the second fixed frame 8, respectively.

Due to the bonding between the fourth adhesive portion 81 and the second adhesive portion 331, when connecting the second fixed part 33 with the second housing 22, the fourth limiting member 811 is configured to be positioned and fitted with the third limiting member 2211, so as to achieve the positioning between the second fixed part 33 and the second housing 22, which is conducive to, on the one hand, improving the convenience of the connection between the second fixed part 33 and the second housing 22, and on the other hand, improving the assembly accuracy between the second fixed part 33 and the second housing 22.

In some embodiments, the first limiting member 2111 is a limiting column, and the second limiting member 711 is a limiting groove or a limiting hole.

The structures of the first limiting member 2111 and the second limiting member 711 are simple, and thus the first limiting member 2111 and the second limiting member 711 are convenient to process and manufacture.

The third limiting member 2211 is a limiting column, and the fourth limiting member 811 is a limiting groove or a limiting hole.

The structures of the third limiting member 2211 and the fourth limiting member 811 are simple, and thus the third limiting member 2211 and the fourth limiting member 811 are convenient to process and manufacture.

The foldable electronic device 100 according to the embodiment of the present disclosure adopts a way of locally connecting the fixed part of the flexible circuit board 3, which may increase the flexibility of the flexible circuit board 3, prolong the service life of the flexible circuit board 3, and improve the assembly efficiency of the flexible circuit board 3.

Embodiment 4

The difference between the foldable electronic device 100 according to this embodiment of the present disclosure and that in embodiment 1 described above is in that: the foldable electronic device 100 not only has the structure described in embodiment 1, but also has the structure described in embodiment 3.

Specifically, the foldable electronic device 100 includes the rotation shaft 1, the housing assembly 2 and the flexible circuit board 3, the housing assembly 2 includes the first housing 21 and the second housing 22, and the first housing 21 and the second housing 22 are rotatably connected to both sides of the rotation shaft 1, respectively, so that the foldable electronic device 100 can switch between the flattened state and the folded state. The flexible circuit board 3 includes the bendable bending part 32, and the flexible circuit board 3 includes the plurality of layers of circuit board bodies arranged in a stack.

The first housing 21 has the first arc-shaped surface 212, and in the process of switching from the folded state to the flattened state, the first arc-shaped surface 212 abuts against the bending part 32, to guide the bending part 32 to bend into the preset shape; and/or, the second housing 22 has the second arc-shaped surface 222, and in the process of switching from the folded state to the flattened state, the second arc-shaped surface 222 abuts against the bending part 32, to guide the bending part 32 to bend into the preset shape.

The first housing 21 has the first mounting part 211, the flexible circuit board 3 includes the first fixed part 31 and the bendable bending part 32 arranged in sequence, and the first fixed part 31 is connected with the first mounting part 211. The first fixed part 31 includes the first adhesive portion 311 and the first non-adhesive portion 312, the adjacent two layers of circuit board bodies are bonded at the first adhesive portion 311, and the adjacent two layers of circuit board bodies can move relative to each other at the first non-adhesive portion 312. And/or, the second housing 22 has the second mounting part 221, the flexible circuit board 3 includes the bendable bending part 32 and the second fixed part 33 arranged in sequence, and the second fixed part 33 is connected with the second mounting part 221. The second fixed part 33 includes the second adhesive portion 331 and the second non-adhesive portion 332, the adjacent two layers of circuit board bodies are bonded at the second adhesive portion 331, and the adjacent two layers of circuit board bodies can move relative to each other at the second non-adhesive portion 332.

Embodiment 5

The difference between the foldable electronic device 100 according to this embodiment of the present disclosure and that in embodiment 2 described above is in that: the foldable electronic device 100 not only has the structure described in embodiment 2, but also has the structure described in embodiment 3.

Specifically, the foldable electronic device 100 includes the rotation shaft 1, the housing assembly 2 and the flexible circuit board 3, the housing assembly 2 includes the first housing 21 and the second housing 22, and the first housing 21 and the second housing 22 are rotatably connected to both sides of the rotation shaft 1, respectively, so that the foldable electronic device 100 can switch between the flattened state and the folded state. The flexible circuit board 3 includes the bendable bending part 32, and the flexible circuit board 3 includes the plurality of layers of circuit board bodies arranged in a stack.

The foldable electronic device 100 further includes the first compressing member 4, the first compressing member 4 is connected with the first housing 21, the first compressing member 4 has the third arc-shaped surface 41, and in the process of switching from the folded state to the flattened state, the third arc-shaped surface 41 abuts against the bending part 32 to guide the bending part 32 to bend into the preset shape; and/or, the foldable electronic device 100 further includes the second compressing member 5, the second compressing member 5 is connected with the second housing 22, the second compressing member 5 has the fourth arc-shaped surface 51, and in the process of switching from the folded state to the flattened state, the fourth arc-shaped surface 51 abuts against the bending part 32 to guide the bending part 32 to bend into the preset shape.

The first housing 21 has the first mounting part 211, the flexible circuit board 3 includes the first fixed part 31 and the bendable bending part 32 arranged in sequence, and the first fixed part 31 is connected with the first mounting part 211. The first fixed part 31 includes the first adhesive portion 311 and the first non-adhesive portion 312, the adjacent two layers of circuit board bodies are bonded at the first adhesive portion 311, and the adjacent two layers of circuit board bodies can move relative to each other at the first non-adhesive portion 312. And/or, the second housing 22 has the second mounting part 221, the flexible circuit board 3 includes the bendable bending part 32 and the second fixed part 33 arranged in sequence, and the second fixed part 33 is connected with the second mounting part 221. The second fixed part 33 includes the second adhesive portion 331 and the second non-adhesive portion 332, the adjacent two layers of circuit board bodies are bonded at the second adhesive portion 331, and the adjacent two layers of circuit board bodies can move relative to each other at the second non-adhesive portion 332.

Although the embodiments of the present disclosure have been shown and described above, the above embodiments are illustrative and shall not be considered as limitation to the present disclosure, and changes, modifications, alternatives and variations made to the above embodiments shall fall within the protection scope of the present disclosure.

What is claimed is:

1. A foldable electronic device, comprising:
a rotation shaft;
a housing assembly comprising a first housing and a second housing, and the first housing and the second housing being rotatably connected to both sides of the rotation shaft, respectively, to allow the foldable electronic device to switch between a flattened state and a folded state; and
a flexible circuit board comprising a bendable bending part,
wherein the foldable electronic device is configured in following manners:
the first housing has a first arc-shaped surface, and in a process of switching from the folded state to the flattened state, the first arc-shaped surface abuts against the bending part, to guide the bending part to bend into a preset shape; and
the second housing has a second arc-shaped surface, and in the process of switching from the folded state to the flattened state, the second arc-shaped surface abuts against the bending part, to guide the bending part to bend into a preset shape;
and a first compressing member connected with the first housing, the first compressing member having a third arc-shaped surface, and in the process of switching from the folded state to the flattened state, the third arc-shaped surface abutting against the bending part, to guide the bending part to bend into the preset shape; and a second compressing member connected with the second housing, the second compressing member having a fourth arc-shaped surface, and in the process of switching from the folded state to the flattened state, the fourth arc-shaped surface abutting against the bending part, to guide the bending part to bend into the preset shape; and in the flattened state, the housing assembly has a first surface and a second surface facing away from each other, and one of the first surface and the second surface is configured to support a flexible screen, wherein the foldable electronic device is further configured in following manners: the bending part comprises a first convex portion, a second convex portion and a third convex portion arranged in sequence, the second convex portion is arranged to protrude towards the first surface, the first convex portion and the third convex portion are arranged to protrude away from the first surface, the first arc-shaped surface abuts against part of the first convex portion adjacent to the second convex portion in a direction towards the first surface, and the third arc-shaped surface abuts against part of the third convex portion adjacent to the second convex portion in the direction towards the first surface; and the bending part comprises a fourth convex portion, a fifth convex portion and a sixth convex portion arranged in sequence, the fifth convex portion is arranged to protrude towards the first surface, the fourth convex portion and the sixth convex portion are arranged to protrude away from the first surface, the second arc-shaped surface abuts against part of the fourth convex portion adjacent to the fifth convex portion in a direction towards the first surface, and the fourth arc-shaped surface abuts against part of the sixth convex portion adjacent to the fifth convex portion in the direction towards the first surface.

2. The foldable electronic device according to claim 1, further configured in at least one of following manners:
the first housing further has a fifth arc-shaped surface, and in the process of switching between the flattened state and the folded state, the part of the third convex portion adjacent to the second convex portion is clamped between the third arc-shaped surface and the fifth arc-shaped surface; or
the second housing further has a sixth arc-shaped surface, and in the process of switching between the flattened state and the folded state, the part of the sixth convex portion adjacent to the fifth convex portion is clamped between the fourth arc-shaped surface and the sixth arc-shaped surface.

3. The foldable electronic device according to claim 2, further configured in at least one of following manners:
at least one of the third arc-shaped surface or the fifth arc-shaped surface is a convex arc-shaped surface arranged to protrude towards the bending part; or
at least one of the fourth arc-shaped surface or the sixth arc-shaped surface is a convex arc-shaped surface arranged to protrude towards the bending part.

4. The foldable electronic device according to claim 1, further configured in at least one of following manners:
the first arc-shaped surface is a convex arc-shaped surface arranged to protrude towards the bending part; or
the second arc-shaped surface is a convex arc-shaped surface arranged to protrude towards the bending part.

5. The foldable electronic device according to claim 1, wherein the first housing has a first through hole for the bending part to pass through, a first part of the first compressing member is arranged outside the first through hole and is connected with the first housing, a second part of the first compressing member is arranged inside the first through hole and matches with the first through hole, and the third arc-shaped surface is arranged on the second part of the first compressing member located inside the first through hole; or
the second housing has a second through hole for the bending part to pass through, a first part of the second compressing member is arranged outside the second through hole and is connected with the second housing, a second part of the second compressing member is arranged inside the second through hole and matches with the second through hole, and the fourth arc-shaped surface is arranged on the second part of the second compressing member located inside the second through hole.

6. The foldable electronic device according to claim 5, further configured in at least one of following manners:
the first compressing member comprises a first rigid part and a first elastic part connected with each other, the first rigid part is connected with the first housing, and the first elastic part is in interference fit with a wall defining the first through hole; or
the second compressing member comprises a second rigid part and a second elastic part connected with each other, the second rigid part is connected with the second housing, and the second elastic part is in interference fit with a wall defining the second through hole.

7. The foldable electronic device according to claim 6, wherein further configured in at least one of following manners:

the first elastic part comprises a first main body portion and a first limiting rib, the first main body portion is connected with the first rigid part, the first limiting rib is arranged around the first main body portion, and the first limiting rib is in interference fit with the wall defining the first through hole; or the second elastic part comprises a second main body portion and a second limiting rib, the second main body portion is connected with the second rigid part, the second limiting rib is arranged around the second main body portion, and the second limiting rib is in interference fit with the wall defining the second through hole.

8. The foldable electronic device according to claim 6, further configured in at least one of following manners:

the first rigid part comprises a first connecting portion and a first supporting portion, the first connecting portion is connected with the first housing, at least part of the first supporting portion extends into the first through hole, and the at least part of the first supporting portion is embedded inside the first elastic part; or the second rigid part comprises a second connecting portion and a second supporting portion, the second connecting portion is connected with the second housing, at least part of the second supporting portion extends into the second through hole, and the at least part of the second supporting portion is embedded inside the second elastic part.

9. The foldable electronic device according to claim 6, further configured in at least one of following manners:

the first through hole is an elongated hole, the first housing comprises a plurality of first positioning parts, the plurality of first positioning parts are arranged at intervals along a length direction of the first through hole, the first compressing member comprises a plurality of second positioning parts, the second positioning parts have one-to-one correspondence with the first positioning parts, and each second positioning part is positioned and fitted with a corresponding first positioning part; or the second through hole is an elongated hole, the second housing comprises a plurality of third positioning parts, the plurality of third positioning parts are arranged at intervals along a length direction of the second through hole, the second compressing member comprises a plurality of fourth positioning parts, the fourth positioning parts have one-to-one correspondence with the third positioning parts, and each fourth positioning part is positioned and fitted with a corresponding third positioning part.

10. The foldable electronic device according to claim 9, further configured in at least one of following manners:

each first positioning part is a first positioning column, the first positioning column has a cylindrical shape, each second positioning part is a first positioning hole, one part of the first positioning holes is a circular hole, and the other part of the first positioning holes is an elongated hole; or each third positioning part is a second positioning column, the second positioning column has a cylindrical shape, each fourth positioning part is a second positioning hole, one part of the second positioning holes is a circular hole, and the other part of the second positioning holes is an elongated hole.

11. The foldable electronic device according to claim 5, further configured in at least one of following manners:

the first through hole is an elongated hole, the first housing comprises a first portion and a second portion arranged opposite to each other in a width direction of the first through hole, the first part of the first compressing member is connected with the first portion, the second portion comprises a first stopping part on a side away from the bending part, and the first stopping part is configured to stop the first compressing member; or the second through hole is an elongated hole, the second housing comprises a third portion and a fourth portion arranged opposite to each other in a width direction of the second through hole, the first part of the second compressing member is connected with the third portion, the fourth portion comprises a second stopping part on a side away from the bending part, and the second stopping part is configured to stop the second compressing member.

* * * * *